(12) United States Patent
Stanton

(10) Patent No.: US 11,271,023 B2
(45) Date of Patent: Mar. 8, 2022

(54) QUANTUM WAVEGUIDE INFRARED PHOTODETECTOR

(71) Applicant: Government of the United States of America, as represented by the Secretary of Commerce, Gaithersburg, MD (US)

(72) Inventor: Eric John Stanton, Boulder, CO (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 29 days.

(21) Appl. No.: 16/919,515

(22) Filed: Jul. 2, 2020

(65) Prior Publication Data

US 2021/0028214 A1    Jan. 28, 2021

Related U.S. Application Data

(60) Provisional application No. 62/877,932, filed on Jul. 24, 2019.

(51) Int. Cl.
| | | |
|---|---|---|
| *H01L 31/103* | (2006.01) | |
| *H01L 27/146* | (2006.01) | |
| *H01L 31/0232* | (2014.01) | |
| *H01L 31/0352* | (2006.01) | |

(52) U.S. Cl.
CPC .. *H01L 27/14625* (2013.01); *H01L 27/14669* (2013.01); *H01L 31/02327* (2013.01); *H01L 31/035218* (2013.01)

(58) Field of Classification Search
CPC ......... H01L 27/14625; H01L 31/02327; H01L 31/035218; H01L 27/14669; H01L 31/02027; H01L 31/101; H01L 31/102; H01L 31/103; H01L 31/107; H01L 31/1075
See application file for complete search history.

(56) References Cited

U.S. PATENT DOCUMENTS

| | | | | |
|---|---|---|---|---|
| 5,937,274 A | * | 8/1999 | Kondow | ........... H01L 21/02392 |
| | | | | 438/47 |
| 2004/0046176 A1 | * | 3/2004 | Kim | ...................... H01L 31/101 |
| | | | | 257/83 |
| 2021/0210646 A1 | * | 7/2021 | Maros | ............... H01L 31/03048 |

* cited by examiner

*Primary Examiner* — Eduardo A Rodela
(74) *Attorney, Agent, or Firm* — Office of Chief Counsel for National Institute of Standards and Technology

(57) ABSTRACT

A quantum waveguide infrared photodetector includes: a photon absorption layer that receives infrared photons propagating longitudinally along a longitudinal length of the photon absorption layer, converts the infrared photons into electrons, and communicates the electrons to a conductor layer; a first conductor layer that receives a first electrical potential; and a second conductor layer that receives a second electrical potential, wherein electrons produced by the photon absorption layer are communicated from the photon absorption layer: to the first conductor layer when the first electrical potential is more positive than the second electrical potential, and to the second conductor layer when the second electrical potential is more positive than the first electrical potential, an electrical current produced by the electrons is proportional to an amount of absorption of the infrared photons in the photon absorption layer.

16 Claims, 31 Drawing Sheets step 303 step 304 step 305 step 309 step 310 step 295 step 296 step 297 step 298 step 299 step 300 step 301 step 302 step 309 step 310

QUANTUM WAVEGUIDE INFRARED PHOTODETECTOR

CROSS REFERENCE TO RELATED APPLICATIONS

The application claims priority to U.S. Provisional Patent Application Ser. No. 62/877,932 filed Jul. 24, 2019, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 975-2573; email tpo@nist.gov; reference NIST Docket Number 19-042US1.

BRIEF DESCRIPTION

Disclosed is a quantum waveguide infrared photodetector for detecting infrared photons by intersubband transitions in a semiconductor of a photon absorption layer, the quantum waveguide infrared photodetector comprising: the photon absorption layer that receives infrared photons propagating longitudinally along a longitudinal length of the photon absorption layer, converts the infrared photons into electrons, and communicates the electrons to a conductor layer; a barrier layer on which the photon absorption layer is disposed; a semiconductor contact layer on which the barrier layer is disposed; a semiconductor member on which the semiconductor contact layer is disposed; a substrate on which the semiconductor member is disposed; a barrier layer disposed on the photon absorption layer; a buffer layer disposed on the barrier layer; a semiconductor contact layer disposed on the buffer layer; a first conductor layer disposed on the semiconductor contact layer and that receives a first electrical potential; and a second conductor layer disposed on the semiconductor contact layer and that receives a second electrical potential, wherein electrons produced by the photon absorption layer in response to receipt of the infrared photons are communicated from the photon absorption layer: to the first conductor layer when the first electrical potential is more positive than the second electrical potential, and to the second conductor layer when the second electrical potential is more positive than the first electrical potential, an electrical current produced by the electrons is proportional to an amount of absorption of the infrared photons in the photon absorption layer.

Disclosed is a process for detecting infrared photons by intersubband transitions in a semiconductor of a photon absorption layer with the quantum waveguide infrared photodetector of claim 1, the process comprising: receiving, by the photon absorption layer, the infrared photons; propagating longitudinally the infrared photons along the longitudinal length of the photon absorption layer; converting, by the photon absorption layer, the infrared photons into electrons by intersubband transitions in the semiconductor of the photon absorption layer; biasing the first conductor layer with the first electrical potential; biasing the second conductor layer with the second electrical potential; communicating the electrons from the photon absorption layer to the first conductor layer when the first electrical potential is more positive than the second electrical potential; and communicating the electrons from the photon absorption layer to the second conductor layer when the second electrical potential is more positive than the first electrical potential to detect the infrared photons, wherein an electrical current produced by the electrons is proportional to the amount of absorption of the infrared photons in the photon absorption layer.

BRIEF DESCRIPTION OF THE DRAWINGS

The following description should not be considered limiting in any way. With reference to the accompanying drawings, like elements are numbered alike.

DETAILED DESCRIPTION

A detailed description of one or more embodiments is presented herein by way of exemplification and not limitation.

It has been discovered that quantum waveguide infrared photodetector 200 provides a greater signal-to-noise ratio compared with conventional infrared detectors. Beneficially, quantum waveguide infrared photodetector 200 receives infrared photons injected in absorbing regions of quantum waveguide infrared photodetector 200 in a plane of material layers of quantum waveguide infrared photodetector 200 instead of surface normal to the material layers of quantum waveguide infrared photodetector 200 as conventional detectors do. Unexpectedly, quantum waveguide infrared photodetector 200 provides room-temperature detection of infrared light with high sensitivity and high speed and can be a detector for infrared absorption spectroscopy, optical coherence tomography, light detection and ranging, communications, and the like.

Figure 1:
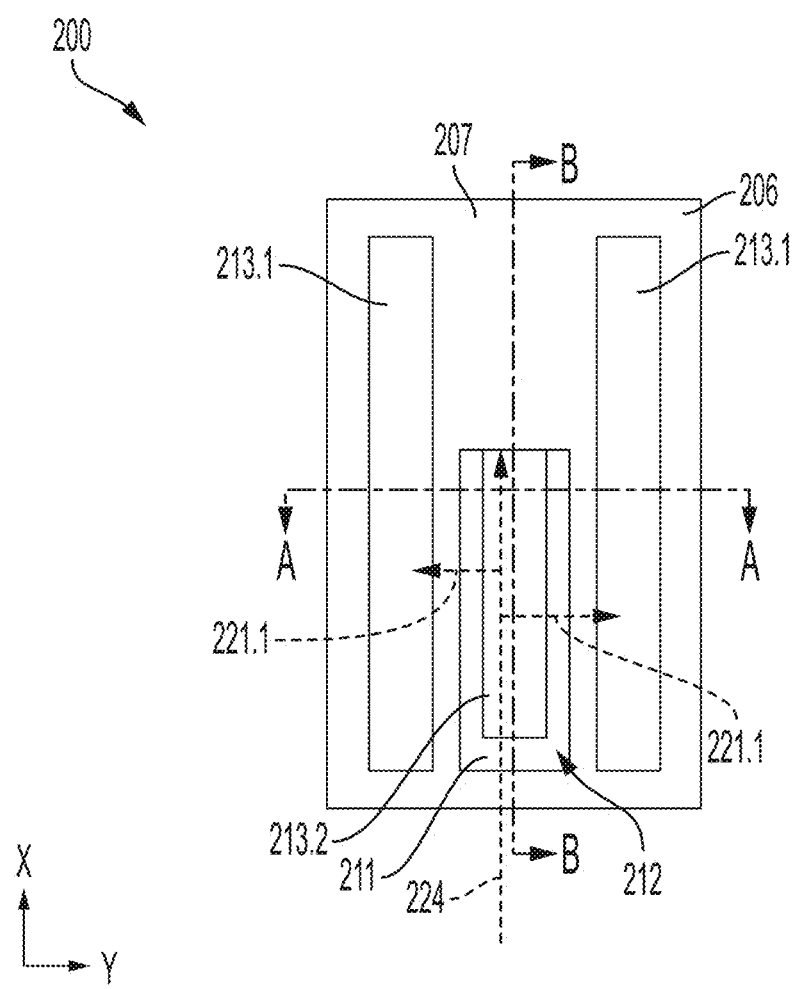
FIG. 1 shows a plan view of an embodiment of quantum waveguide infrared photodetector 200.

Quantum waveguide infrared photodetector 200 detects infrared photons 224 by intersubband transitions in a semiconductor of photon absorption layer 208. In an embodiment, with reference to FIG. 1, FIG. 2, FIG. 3, FIG. 4, FIG. 5, FIG. 6, and FIG. 7, quantum waveguide infrared photodetector 200 includes: photon absorption layer 208 that receives infrared photons 224 propagating longitudinally along a longitudinal length (indicated in FIG. 1 as being in a direction along X-axis) of photon absorption layer 208, converts infrared photons 224 into electrons 221, and communicates electrons 221 to conductor layer 213; barrier layer 214 on which photon absorption layer 208 is disposed; semiconductor contact layer 206 on which barrier layer 214 is disposed; semiconductor member 202 on which semiconductor contact layer 206 is disposed; a substrate 201 on which semiconductor member 202 is disposed; a barrier layer 209 disposed on photon absorption layer 208; a buffer layer 210 disposed on barrier layer 209; a semiconductor contact layer 211 disposed on buffer layer 210; a first conductor layer 213.1 disposed on semiconductor contact layer 206 and that receives a first electrical potential; and a second conductor layer 213.2 disposed on semiconductor contact layer 211 and that receives a second electrical potential, wherein electrons 221 produced by photon absorption layer 208 in response to receipt of infrared photons 224 are communicated from photon absorption layer 208: to first conductor layer 213.1 (as electrons 221.1) when the first electrical potential is more positive than the second electrical potential, and to second conductor layer 213.2 (as electrons 221.2) when the second electrical potential is more positive than the first electrical potential, an electrical current produced by electrons 221 is proportional to an amount of absorption of infrared photons 224 in photon absorption layer 208.

In an embodiment, quantum waveguide infrared photodetector 200 further includes mode confinement layer 203 interposed between substrate 201 and semiconductor member 202 and bounded by surfaces of substrate 201 and semiconductor member 202.

In an embodiment, quantum waveguide infrared photodetector 200 further includes core layer 215 interposed between substrate 201 and semiconductor member 202.

In an embodiment, quantum waveguide infrared photodetector 200 further includes bottom cladding 216 interposed between core layer 215 and substrate 201.

In an embodiment, quantum waveguide infrared photodetector 200 further includes mode confinement layer 203 disposed in core layer 215 and interposed between bottom cladding 216 and semiconductor member 202.

In an embodiment, quantum waveguide infrared photodetector 200 further includes mode confinement layer 203 is bounded by surfaces of bottom cladding 216, core layer 215, and semiconductor member 202.

In an embodiment, quantum waveguide infrared photodetector 200 further includes second mode confinement layer 203.2 disposed in semiconductor member 202, interposed between semiconductor member 202 and semiconductor contact layer 206, and bounded by surfaces of semiconductor member 202 and semiconductor contact layer 206.

In an embodiment, quantum waveguide infrared photodetector 200 further includes first electrical contact pad 220.1 disposed on substrate 201 and first conductor layer 213.1 and in electrical communication with first conductor layer 213.1, such that first electrical contact pad 220.1 receives the first electrical potential for electrically biasing first conductor layer 213.1.

In an embodiment, quantum waveguide infrared photodetector 200 further includes second electrical contact pad 220.2 disposed on substrate 201 and second conductor layer 213.2 and in electrical communication with second conductor layer 213.2, such that second electrical contact pad 220.2 receives the second electrical potential for electrically biasing second conductor layer 213.2.

Figure 16:
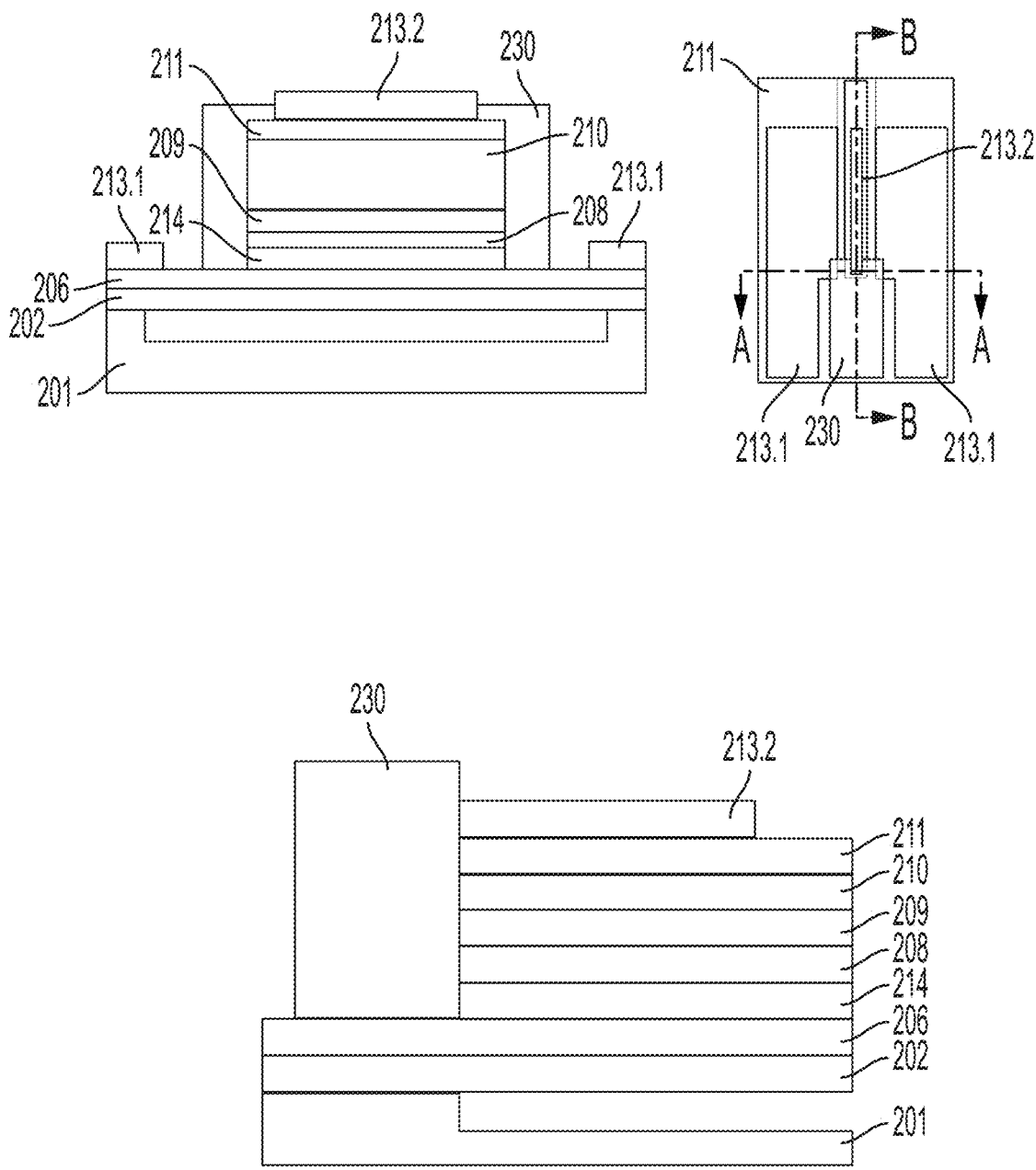
FIG. 16 shows steps involved in making quantum waveguide infrared photodetector 200 show in FIG. 2.
Figure 17:
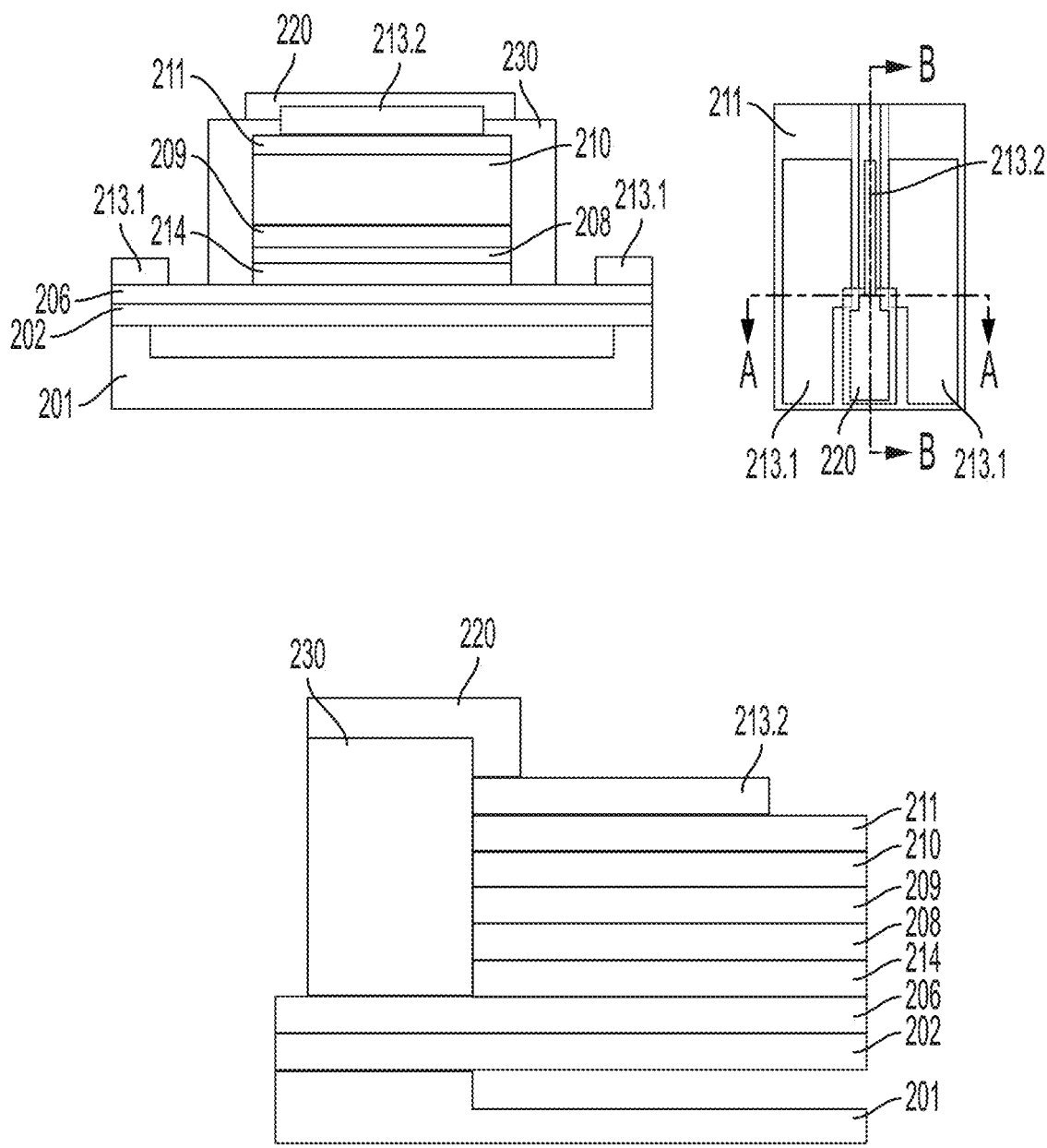
FIG. 17 shows steps involved in making quantum waveguide infrared photodetector 200 show in FIG. 2.
Figure 18:
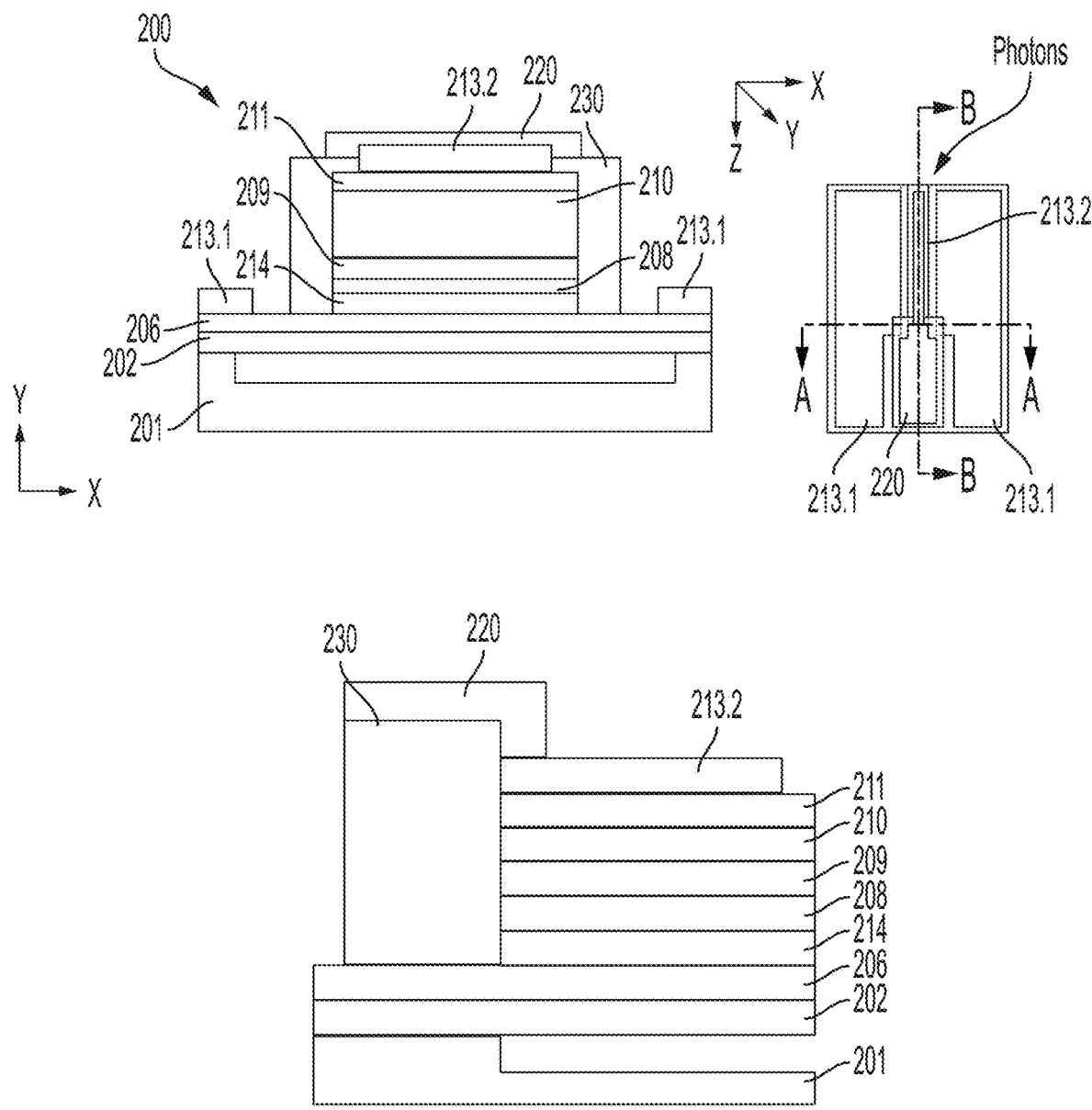
FIG. 18 shows steps involved in making quantum waveguide infrared photodetector 200 show in FIG. 2.
Figure 19:
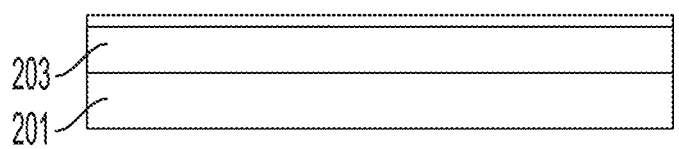
FIG. 19 shows steps involved in making quantum waveguide infrared photodetector 200 show in FIG. 3.
Figure 19:
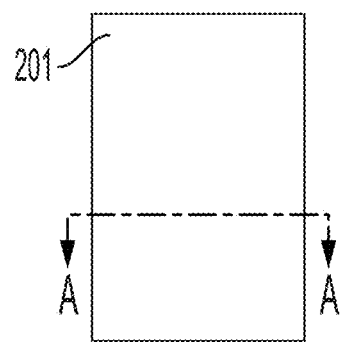
Figure 19:
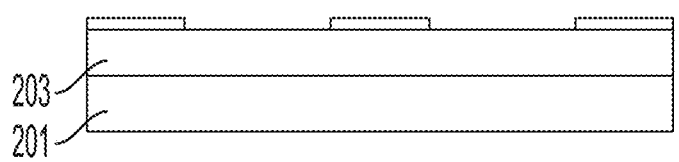
Figure 19:
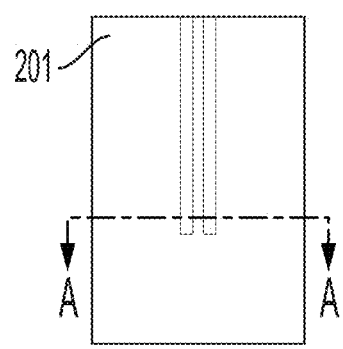
Figure 19:
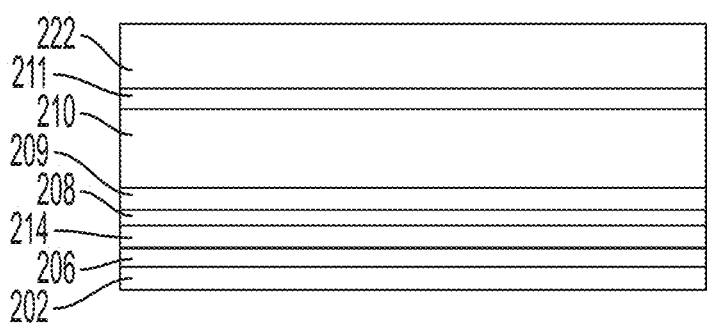
Figure 19:
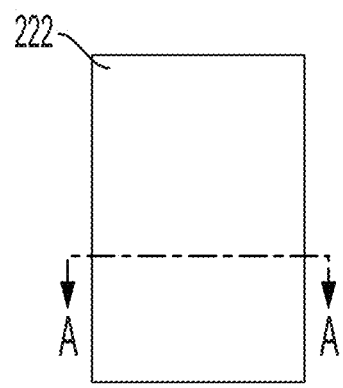
Figure 20:
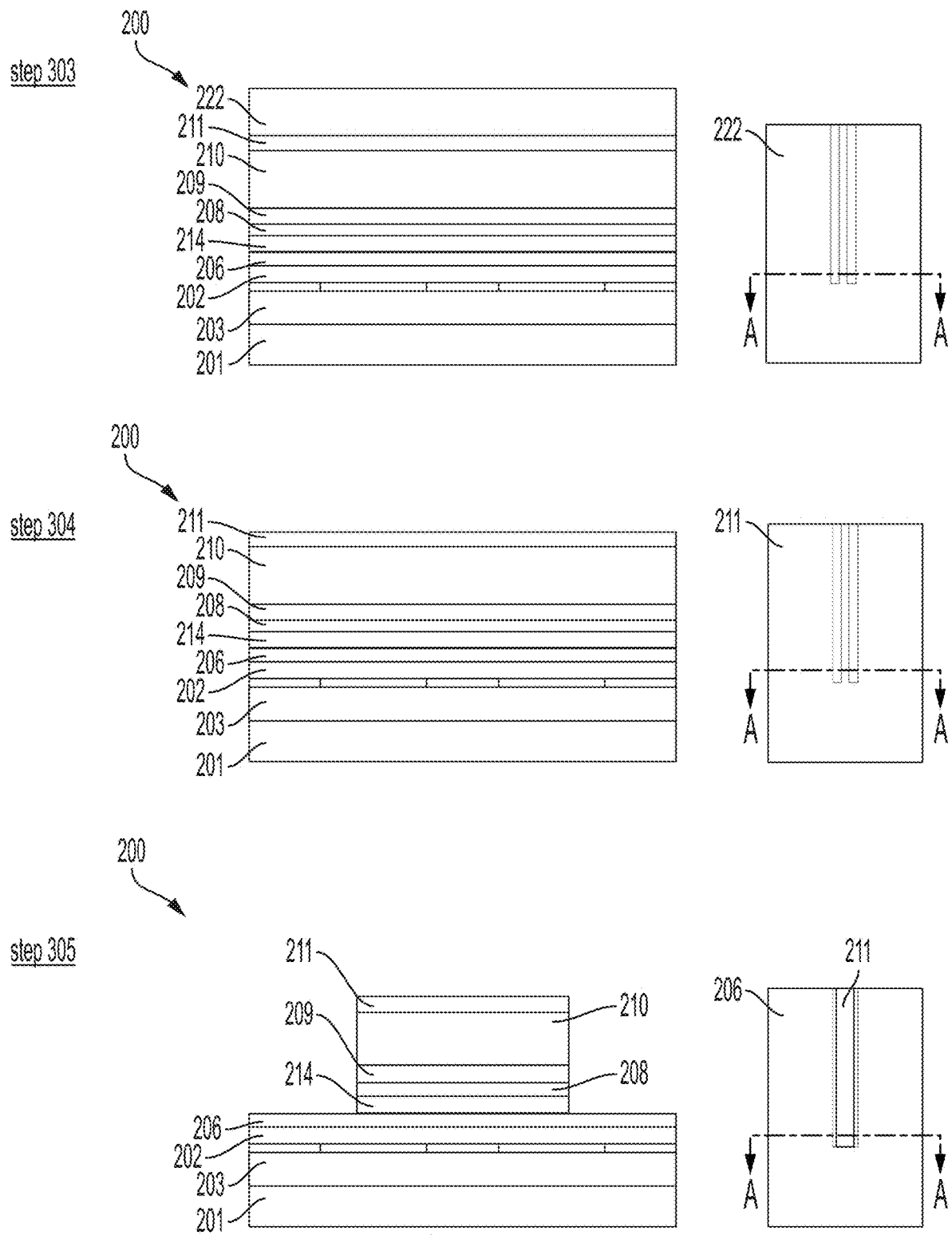
FIG. 20 shows steps involved in making quantum waveguide infrared photodetector 200 show in FIG. 3.
Figure 21:
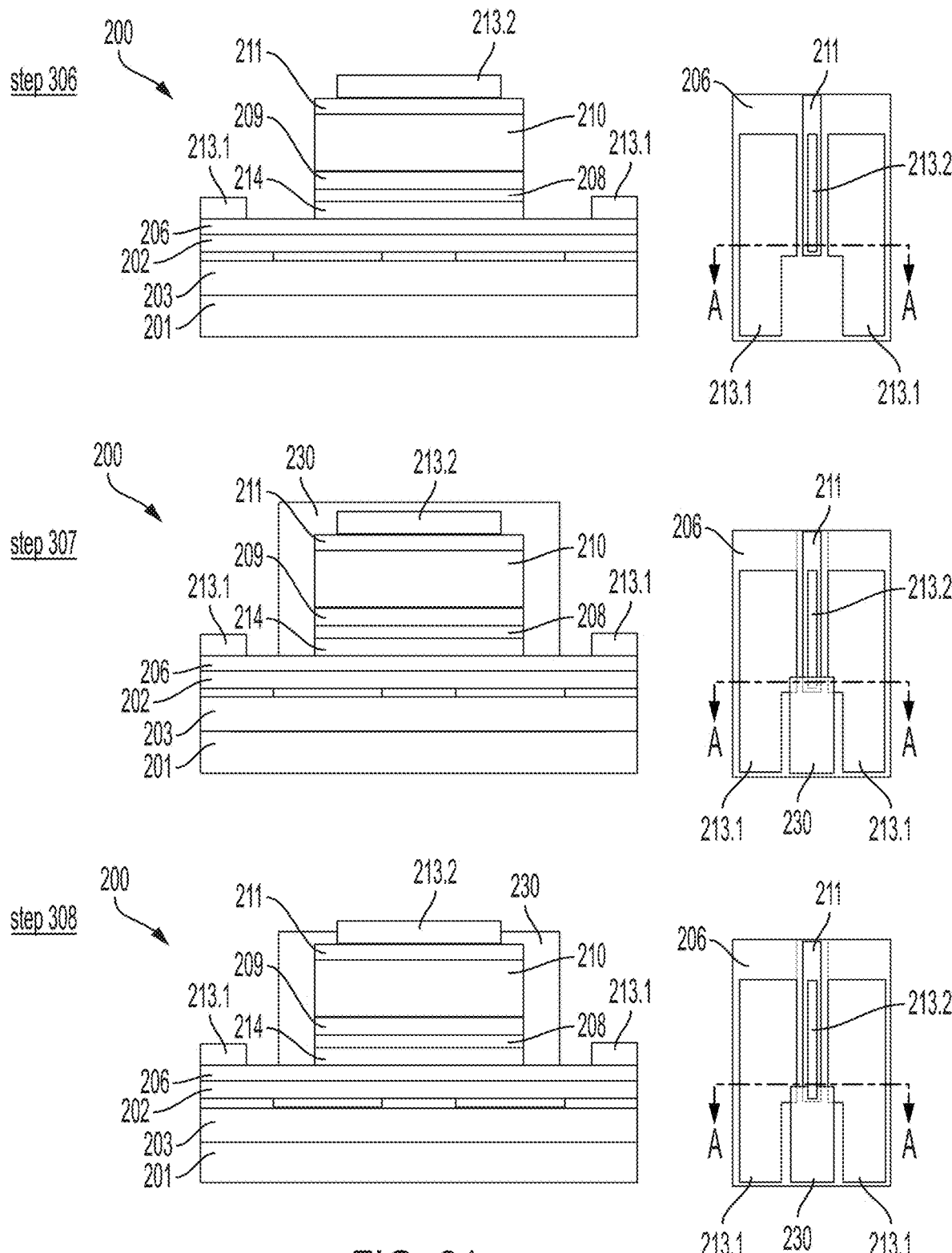
FIG. 21 shows steps involved in making quantum waveguide infrared photodetector 200 show in FIG. 3.
Figure 22:
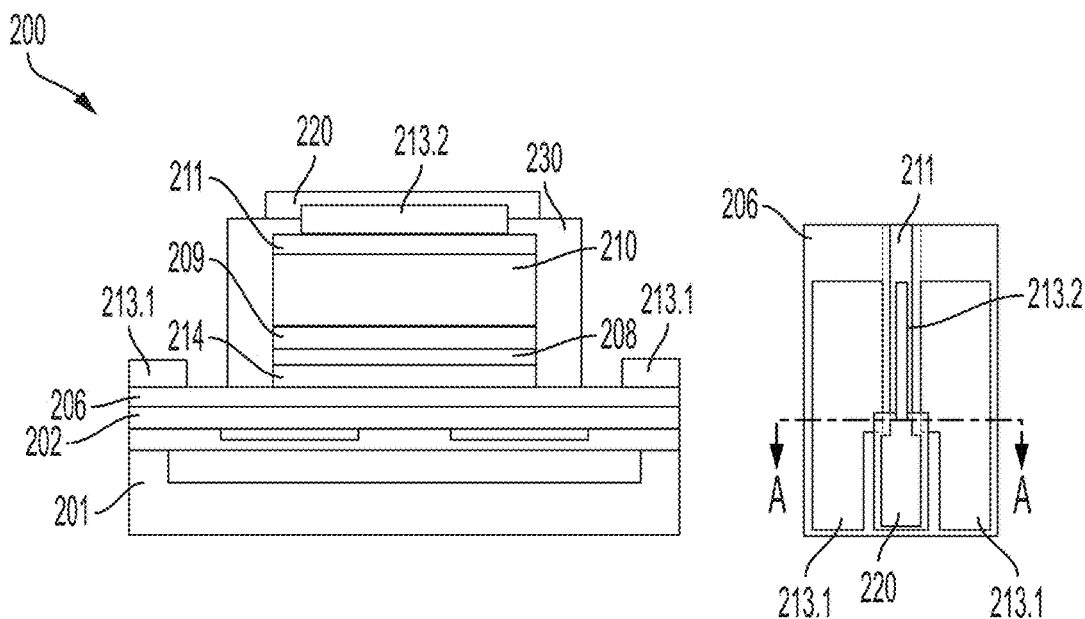
FIG. 22 shows steps involved in making quantum waveguide infrared photodetector 200 show in FIG. 3.
Figure 22:
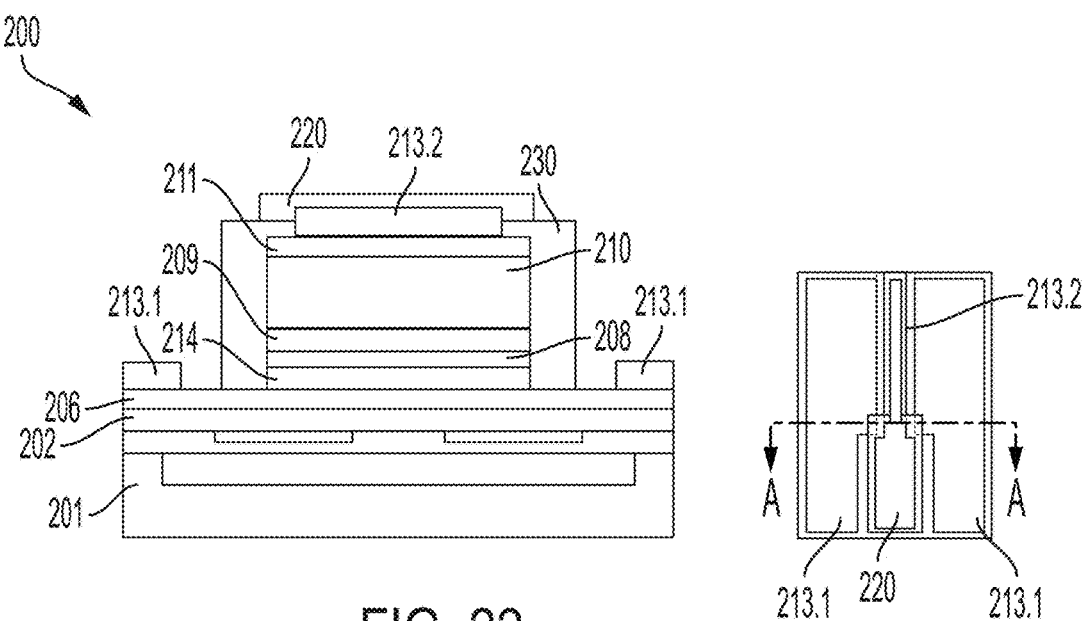

In an embodiment, with reference to FIG. 16, quantum waveguide infrared photodetector 200 further includes electrical insulator 230 disposed on semiconductor contact layer 211 and semiconductor contact layer 206 and that electrically insulates first conductor layer 213.1 from second conductor layer 213.2.

Figure 7A:
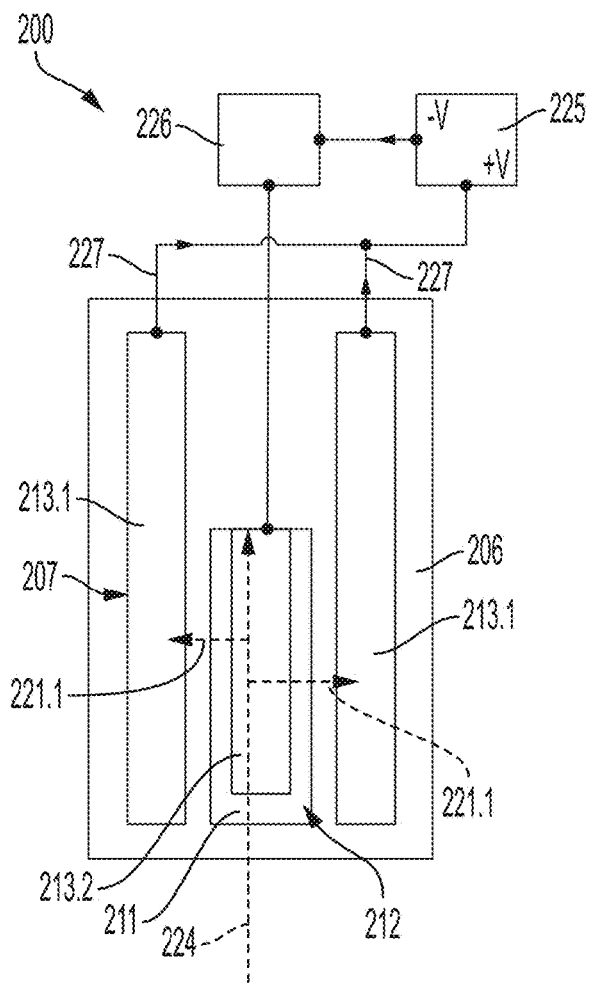
FIG. 7 shows an embodiment of quantum waveguide infrared photodetector 200 with electrons received by conductor layer 213.1 in panel A due to electrical biasing with electrical bias supply 225 and electrons received by conductor layer 213.2 in panel B due to electrical biasing with electrical bias supply 225.
Figure 7B:
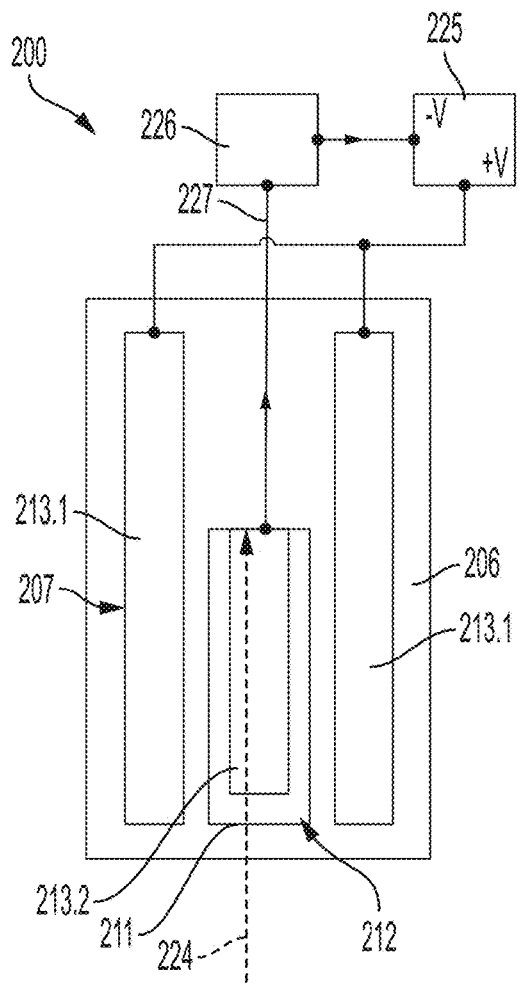

In an embodiment, with reference to FIG. 7, quantum waveguide infrared photodetector 200 further includes electrical bias supply 225 in electrical communication with first conductor layer 213.1 and second conductor layer 213.2, wherein electrical bias supply 225 provides the first electrical potential to first conductor layer 213.1 and the second electrical potential to second conductor layer 213.2. Quantum waveguide infrared photodetector 200 can include current meter 226 in electrical communication with first conductor layer 213.1 and electrical bias supply 225, wherein current meter 226 receives detector signal 227 and determines the amount of electrical current from detector signal 227.

Components of quantum waveguide infrared photodetector 200 can be made from and include various materials. Substrate 201 provides mechanical structure for other elements of quantum waveguide infrared photodetector 200 and provides electrical insulation for quantum waveguide infrared photodetector 200. Substrate 201 can include silicon, quartz, gallium arsenide, and the like. A thickness of substrate 201 can be from 1 nm to 10 mm, specifically from 1 μm to 2 mm, and more specifically from 50 μm to 800 μm. It is contemplated that a diameter of substrate 201 can be from 1 μm to 1 m, specifically from 1 mm to 500 mm, and more specifically from 50 mm to 300 mm. An electrical resistivity of substrate 201 can be from $10^{-10}$ Ωm to $10^{16}$ Ωm, specifically from $10^{-8}$ Ωm to $10^{3}$ Ωm, and more specifically from $10^{-5}$ Ωm to 500 Ωm. Further, if substrate 201 is crystalline, a crystal axis orientation of substrate 201 can be in any direction. In an embodiment, substrate 201 is silicon.

Semiconductor member 202 optimizes the guided optical mode overlap with photon absorption layer 208. Semiconductor member 202 can include silicon, quartz, gallium arsenide, aluminum gallium arsenide, and the like. An elemental composition of this layer can include gallium in an amount from 1 atomic percent (at. %) to 100 at. %, specifically from 25 at. % to 75 at. %, and more specifically from 40 at. % to 60 at. %, based on a total of all atoms in this layer; and arsenic in an amount from 1 atomic percent (at. %) to 100 at. %, specifically from 25 at. % to 75 at. %, and more specifically from 40 at. % to 60 at. %, based on a total of all atoms in this layer. A thickness of semiconductor member 202 can be from 1 nm to 1 cm, specifically from 5 nm to 10 μm, and more specifically from 100 nm to 5 μm. An electrical resistivity of semiconductor member 202 can be from $10^{-10}$ Ωm to $10^{16}$ Ωm, specifically from $10^{-8}$ Ωm to $10^{3}$ Ωm, and more specifically from $10^{-5}$ Ωm to 500 Ωm. In an embodiment, semiconductor member 202 is gallium arsenide. In some embodiments, mode confinement layer 203 is disposed in semiconductor member 202, wherein semiconductor air gap surface 218 and semiconductor air gap surface 219 are surfaces that provide a boundary for mode confinement layer 203 that can be an air gap.

Mode confinement layer 203 provides a lower refractive index than the waveguide core and has low loss so the optical mode is efficiently guided through photon absorption layer 208 without radiating infrared photons 224 toward substrate 201. Mode confinement layer 203 can include an air gap, aluminum gallium arsenide, and the like. An elemental composition of this layer can include gallium in an amount from 0 atomic percent (at. %) to 100 at. %, specifically from 5 at. % to 95 at. %, and more specifically from 10 at. % to 80 at. %, based on a total of gallium and aluminum atoms in this layer; aluminum in an amount from 0 atomic percent (at. %) to 100 at. %, specifically from 5 at. % to 95 at. %, and more specifically from 20 at. % to 90 at. %, based on a total of gallium and aluminum atoms in this layer; and arsenic in an amount from 1 atomic percent (at. %) to 100 at. %, specifically from 25 at. % to 75 at. %, and more specifically from 40 at. % to 60 at. %, based on a total of all atoms in this layer. A thickness of mode confinement layer 203 can be from 1 nm to 1 cm, specifically from 100 nm to 1 mm, and more specifically from 200 nm to 10 μm. It is contemplated that a width of mode confinement layer 203 can be from 1 nm to 1 cm, specifically from 500 nm to 1 mm, and more specifically from 1 μm to 50 μm. An electrical resistivity of mode confinement layer 203 can be from $10^{-10}$ Ωm to $10^{16}$ Ωm, specifically from $10^{-8}$ Ωm to $10^{3}$ Ωm, and more specifically from $10^{-5}$ Ωm to 500 Ωm. In an embodiment, mode confinement layer 203 is an air gap. Substrate gap surface 204 and semiconductor gap surface 205 are surfaces that provide a boundary for mode confinement layer 203.

Semiconductor contact layer 206 extracts or injects electrons 221 to or from photon absorption layer 208 and barrier layer 214; to provide low resistance to conductor layer 213. Semiconductor contact layer 206 can include silicon, gallium arsenide, aluminum gallium arsenide, and the like. An elemental composition of this layer can include gallium in an amount from 0 atomic percent (at. %) to 100 at. %, specifically from 5 at. % to 95 at. %, and more specifically from 10 at. % to 80 at. %, based on a total of gallium and aluminum atoms in this layer; aluminum in an amount from 0 atomic percent (at. %) to 100 at. %, specifically from 5 at. % to 95 at. %, and more specifically from 20 at. % to 90 at. %, based on a total of gallium and aluminum atoms in this layer; and arsenic in an amount from 1 atomic percent (at. %) to 100 at. %, specifically from 25 at. % to 75 at. %, and more specifically from 40 at. % to 60 at. %, based on a total of all atoms in this layer. A thickness of semiconductor contact layer 206 can be from 1 nm to 1 cm, specifically from 10 nm to 1 mm, and more specifically from 100 nm to 1 μm. It is contemplated that a width of semiconductor contact layer 206 can be from 1 nm to 1 cm, specifically from 100 nm to 1 mm, and more specifically from 1 μm to 10 μm. An electrical resistivity of semiconductor contact layer 206 can be from $10^{-10}$ Ωm to $10^{16}$ Ωm, specifically from $10^{-8}$ Ωm to $10^{3}$ Ωm, and more specifically from $10^{-5}$ Ωm to 500 Ωm. In an embodiment, semiconductor contact layer 206 is gallium arsenide. Semiconductor contact surface 207 is a surface of semiconductor contact layer 206 on which barrier layer 214 and conductor layer 213 are formed.

Photon absorption layer 208 has a chosen composition and thickness to selectively absorb infrared photons 224 incident to or propagating through quantum waveguide infrared photodetector 200. Photon absorption layer 208 can include a quantum well, quantum dot, or quantum dash, wherein exemplary quantum wells include gallium, arsenic, indium, aluminum and the like; exemplary quantum dots include gallium, arsenic, indium, aluminum, and the like; and exemplary quantum dashes include gallium, arsenic, indium, aluminum, and the like. An elemental composition of this layer can include gallium in an amount from 0 atomic percent (at. %) to 100 at. %, specifically from 5 at. % to 95 at. %, and more specifically from 10 at. % to 80 at. %, based on a total of gallium and indium atoms in this layer; indium in an amount from 0 atomic percent (at. %) to 100 at. %, specifically from 5 at. % to 95 at. %, and more specifically from 20 at. % to 90 at. %, based on a total of gallium and indium atoms in this layer; and arsenic in an amount from 1 atomic percent (at. %) to 100 at. %, specifically from 25 at. % to 75 at. %, and more specifically from 40 at. % to 60 at. %, based on a total of all atoms in this layer. A thickness of photon absorption layer 208 can be from 100 μm to 1 cm, specifically from 1 nm to 100 nm, and more specifically from 2 nm to 10 nm. It is contemplated that a width of photon absorption layer 208 can be from 1 nm to 1 cm, specifically from 100 nm to 10 mm, and more specifically from 1 μm to 100 μm. An electrical resistivity of photon absorption layer 208 can be from $10^{-10}$ Ωm to $10^{16}$ Ωm, specifically from $10^{-8}$ Ωm to $10^3$ Ωm, and more specifically from $10^{-5}$ Ωm to 500 Ωm. Further, photon absorption layer 208 can absorb wavelengths from 100 nm to 100 Ωm, specifically from 1 μm to 20 μm, more specifically from 2 μm to 15 μm. In an embodiment, photon absorption layer 208 is a quantum well that includes indium gallium arsenide.

In an embodiment, quantum waveguide infrared photodetector 200 includes a single infrared absorbing layer 208, rather than a plurality of infrared absorbing layers (e.g., ~40 layers) as in conventional devices. In some embodiments, quantum waveguide infrared photodetector 200 includes a plurality of absorption layers, wherein each photon absorption layer 208 has a different quantum well thickness to increase optical bandwidth of quantum waveguide infrared photodetector 200.

Barrier layer 209 supports selected electronic energy states bound or quasi-bound by photon absorption layer 208 to correspond to an energy of infrared photons 224. Barrier layer 209 can include aluminum gallium arsenide and the like. An elemental composition of this layer can include gallium in an amount from 0 atomic percent (at. %) to 100 at. %, specifically from 5 at. % to 95 at. %, and more specifically from 10 at. % to 80 at. %, based on a total of gallium and aluminum atoms in this layer; aluminum in an amount from 0 atomic percent (at. %) to 100 at. %, specifically from 5 at. % to 95 at. %, and more specifically from 20 at. % to 90 at. %, based on a total of gallium and aluminum atoms in this layer; and arsenic in an amount from 1 atomic percent (at. %) to 100 at. %, specifically from 25 at. % to 75 at. %, and more specifically from 40 at. % to 60 at. %, based on a total of all atoms in this layer. A thickness of barrier layer 209 can be from 100 μm to 1 cm, specifically from 1 nm to 1 μm, and more specifically from 2 nm to 500 nm. It is contemplated that a width of barrier layer 209 can be from 1 nm to 1 cm, specifically from 100 nm to 10 mm, and more specifically from 1 μm to 100 μm. An electrical resistivity of barrier layer 209 can be from $10^{-10}$ Ωm to $10^{16}$ Ωm, specifically from $10^{-8}$ Ωm to $10^3$ Ωm, and more specifically from $10^{-5}$ Ωm to 500 Ωm. In an embodiment, barrier layer 209 is aluminum gallium arsenide.

Buffer layer 210 provides a lower refractive index region than the waveguide core and has low loss so the optical mode of infrared photons 224 is efficiently guided without radiating toward semiconductor contact layer 211 or second conductor layer 213.2. Buffer layer 210 can include aluminum gallium arsenide and the like. An elemental composition of this layer can include gallium in an amount from 0 atomic percent (at. %) to 100 at. %, specifically from 5 at. % to 95 at. %, and more specifically from 10 at. % to 80 at. %, based on a total of gallium and aluminum atoms in this layer; aluminum in an amount from 0 atomic percent (at. %) to 100 at. %, specifically from 5 at. % to 95 at. %, and more specifically from 20 at. % to 90 at. %, based on a total of gallium and aluminum atoms in this layer; and arsenic in an amount from 1 atomic percent (at. %) to 100 at. %, specifically from 25 at. % to 75 at. %, and more specifically from 40 at. % to 60 at. %, based on a total of all atoms in this layer. A thickness of buffer layer 210 can be from 100 μm to 1 cm, specifically from 1 nm to 10 μm, and more specifically from 100 nm to 5 μm. It is contemplated that a width of buffer layer 210 can be from 1 nm to 1 cm, specifically from 100 nm to 10 mm, and more specifically from 1 μm to 100 μm. An electrical resistivity of buffer layer 210 can be from $10^{-10}$ Ωm to $10^{16}$ Ωm, specifically from $10^{-8}$ Ωm to $10^3$ Ωm, and more specifically from $10^{-5}$ Ωm to 500 Ωm. In an embodiment, buffer layer 210 is aluminum gallium arsenide.

Semiconductor contact layer 211 extracts or injects electrons 221 to or from photon absorption layer 208 and barrier layer 209 to provide low resistance to second conductor layer 213.2. Semiconductor contact layer 211 can include aluminum gallium arsenide and the like. An elemental composition of this layer can include gallium in an amount from 0 atomic percent (at. %) to 100 at. %, specifically from 5 at. % to 95 at. %, and more specifically from 10 at. % to 80 at. %, based on a total of gallium and aluminum atoms in this layer; aluminum in an amount from 0 atomic percent (at. %) to 100 at. %, specifically from 5 at. % to 95 at. %, and more specifically from 20 at. % to 90 at. %, based on a total of gallium and aluminum atoms in this layer; and arsenic in an amount from 1 atomic percent (at. %) to 100 at. %, specifically from 25 at. % to 75 at. %, and more specifically from 40 at. % to 60 at. %, based on a total of all atoms in this layer. A thickness of semiconductor contact layer 211 can be from 1 nm to 1 cm, specifically from 1 nm to 10 μm, and more specifically from 10 nm to 1 μm. It is contemplated that a width of semiconductor contact layer 211 can be from 1 nm to 1 cm, specifically from 100 nm to 10 mm, and more specifically from 1 μm to 100 μm. An electrical resistivity of semiconductor contact layer 211 can be from $10^{-10}$ Ωm to $10^{16}$ Ωm, specifically from $10^{-8}$ μm to $10^3$ Ωm, and more specifically from $10^{-5}$ Ωm to 500 Ωm. In an embodiment, semiconductor contact layer 211 is gallium arsenide. Top contact surface 212 is a surface of semiconductor contact layer 211 on which second conductor layer 213.2 is formed.

Conductor layer 213 is electrically conductive and provides an electrical interface to quantum waveguide infrared photodetector 200 for communicating detector signal 227 from quantum waveguide infrared photodetector 200 and for subjecting layers of quantum waveguide infrared photodetector 200 to a potential difference. Conductor layer 213 can include a metal (e.g., gold, nickel, germanium, and the like) or other electrically conductive material (e.g., indium tin oxide and the like). A thickness of conductor layer 213 can be from 1 nm to 1 cm, specifically from 10 nm to 1 mm, and more specifically from 100 nm to 2 μm. It is contemplated that a width of conductor layer 213 can be from 1 nm to 1 cm, specifically from 100 nm to 10 mm, and more specifically from 1 μm to 100 μm. An electrical resistivity of conductor layer 213 can be from $10^{-10}$ Ωm to $10^{16}$ t m, specifically from $10^{-8}$ Ωm to $10^3$ Ωm, and more specifically from $10^{-5}$ Ωm to 500 Ωm. In an embodiment, conductor layer 213 is nickel, gold-germanium eutectic alloy, nickel, and gold. Conductor layer 213 can be made of a plurality of stacked layers that, e.g., include an order of layers stacked as follows: nickel, a gold/germanium alloy, nickel, and gold. Other combinations of metals can be used for conductor layer 213. Stacking layers in conductor layer 213 can be referred to as a semiconductor contact metal stack that differs depending on a type of dopant and semiconductor composition of such layers.

Barrier layer 214 supports selected electronic energy states bound by photon absorption layer 208 to correspond to an energy of infrared photons 224. Barrier layer 214 can include aluminum gallium arsenide and the like. An elemental composition of this layer can include gallium in an amount from 0 atomic percent (at. %) to 100 at. %, specifically from 5 at. % to 95 at. %, and more specifically from 10 at. % to 80 at. %, based on a total of gallium and aluminum atoms in this layer; aluminum in an amount from 0 atomic percent (at. %) to 100 at. %, specifically from 5 at. % to 95 at. %, and more specifically from 20 at. % to 90 at. %, based on a total of gallium and aluminum atoms in this layer; and arsenic in an amount from 1 atomic percent (at.

%) to 100 at. %, specifically from 25 at. % to 75 at. %, and more specifically from 40 at. % to 60 at. %, based on a total of all atoms in this layer. A thickness of barrier layer 214 can be from 100 pm to 1 cm, specifically from 1 nm to 1 µm, and more specifically from 2 nm to 500 nm. It is contemplated that a width of barrier layer 214 can be from 1 nm to 1 cm, specifically from 100 nm to 10 mm, and more specifically from 1 µm to 100 µm. An electrical resistivity of barrier layer 214 can be from $10^{-10}$ Ωm to $10^{16}$ Ωm, specifically from $10^{-8}$ Ωm to $10^3$ Ωm, and more specifically from $10^{-5}$ Ωm to 500 Ωm. In an embodiment, barrier layer 214 is aluminum gallium arsenide.

Core layer 215 provides optical confinement of quantum waveguide infrared photodetector 200 and selectively optimizes optical overlap with photon absorption layer 208. Core layer 215 can include silicon, quartz, gallium arsenide, and the like. A thickness of core layer 215 can be from 1 nm to 1 cm, specifically from 100 nm to 1 mm, and more specifically from 200 nm to 10 µm. It is contemplated that a width of core layer 215 can be from 1 nm to 1 cm, specifically from 100 nm to 10 mm, and more specifically from 1 µm to 100 µm. An electrical resistivity of core layer 215 can be from $10^{-10}$ Ωm to $10^{16}$ Ωm, specifically from $10^{-8}$ Ωm to $10^3$ Ωm, and more specifically from $10^{-5}$ m to 500 Ωm. In an embodiment, core layer 215 is silicon. In some embodiments, mode confinement layer 203 is disposed in core layer 215, wherein substrate gap surface 204, semiconductor gap surface 205, and cladding air gap surface 217 are surfaces that provide a boundary for mode confinement layer 203 that can be an air gap.

Bottom cladding 216 has a lower refractive index than core layer 215 and low loss so the optical mode is efficiently guided through photon absorption layer 208 without radiating toward substrate 201. Bottom cladding 216 can include an oxidized material that forms substrate 201, e.g., silicon dioxide and the like. A thickness of bottom cladding 216 can be from 1 nm to 1 cm, specifically from 100 nm to 1 mm, and more specifically from 1 µm to 20 µm. It is contemplated that width of bottom cladding 216 can be from 1 nm to 1 cm, specifically from 500 nm to 1 mm, and more specifically from 1 µm to 50 µm. An electrical resistivity of bottom cladding 216 can be from $10^{-10}$ Ωm to $10^{16}$ Ωm, specifically from $10^{-8}$ Ωm to $10^3$ Ωm, and more specifically from $10^{-5}$ Ωm to 500 Ωm. In an embodiment, bottom cladding 216 is silicon dioxide.

Electrical contact pad 220 is electrically conductive and provides an electrical interface to quantum waveguide infrared photodetector 200 for communicating detector signal 227 from quantum waveguide infrared photodetector 200 and for subjecting layers of quantum waveguide infrared photodetector 200 to a potential difference via conductor layer 213. Electrical contact pad 220 can include a stack of metal layers (e.g., gold, nickel, germanium, and the like) or other electrically conductive material (e.g., indium tin oxide and the like) formatted as a semiconductor contact metal stack. A thickness of electrical contact pad 220 can be from 1 nm to 1 cm, specifically from 10 nm to 1 mm, and more specifically from 100 nm to 2 µm. It is contemplated that a width of electrical contact pad 220 can be from 1 nm to 1 cm, specifically from 100 nm to 10 mm, and more specifically from 1 µm to 100 µm. An electrical resistivity of electrical contact pad 220 can be from $10^{-10}$ Ωm to $10^{16}$ Ωm, specifically from $10^{-8}$ Ωm to $10^3$ Ωm, and more specifically from $10^{-5}$ m to 500 Ωm. In an embodiment, electrical contact pad 220 is titanium and gold.

In accordance with the foregoing description of quantum waveguide infrared photodetector 200, it should be appreciated that quantum waveguide infrared photodetector 200 includes a composite structure of a plurality of components for the waveguide that guides infrared photons 224 longitudinally in quantum waveguide infrared photodetector 200. In an embodiment, with reference to FIG. 2 and FIG. 4, such components include semiconductor contact layer 211, buffer layer 210, barrier layer 209, photon absorption layer 208, barrier layer 214, semiconductor contact layer 206, semiconductor member 202, mode confinement layer 203, and optional electrical insulator 230. In an embodiment, with reference to FIG. 3, such components also include core layer 215 and bottom cladding 216.

Figure 8:
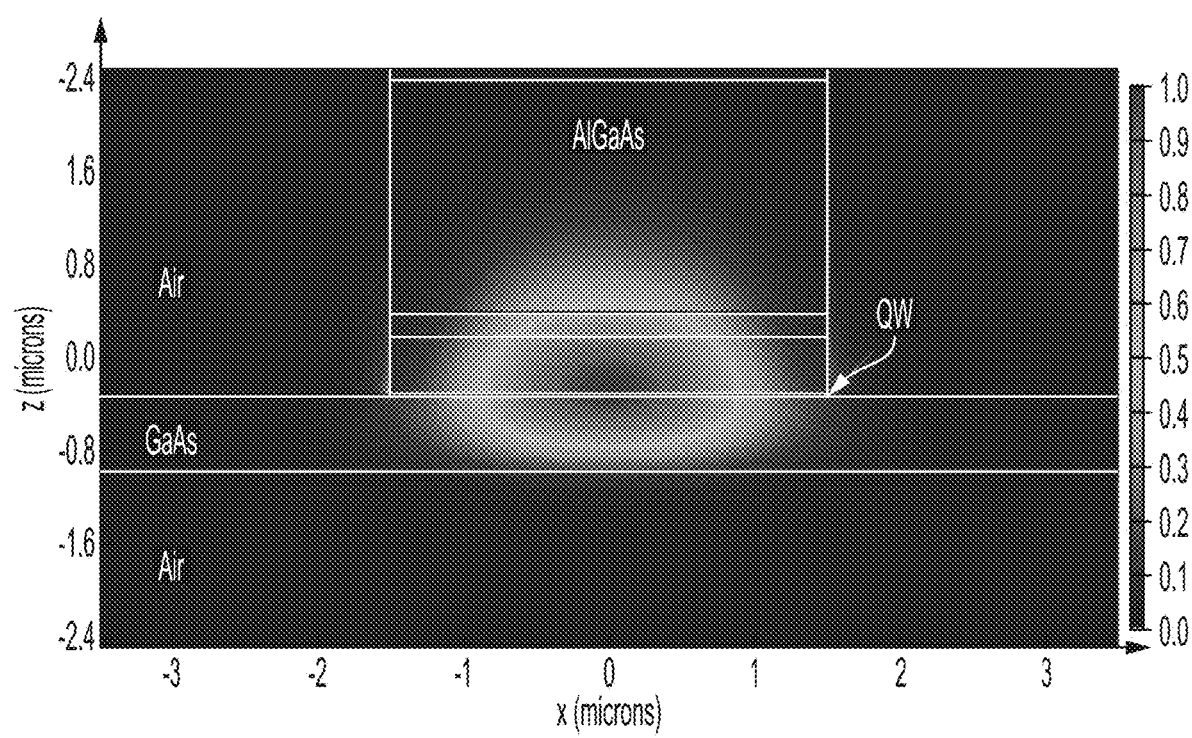
FIG. 8 shows a map of a magnitude of an electromagnetic field of a transverse electromagnetic mode for infrared photons propagating longitudinally in photon absorption layer 208 and layers proximate to photon absorption layer 208 for a transverse cross-section of an embodiment of quantum waveguide infrared photodetector 200.
Figure 9:
FIG. 9 shows steps involved in making quantum waveguide infrared photodetector 200 show in FIG. 2.
Figure 9:
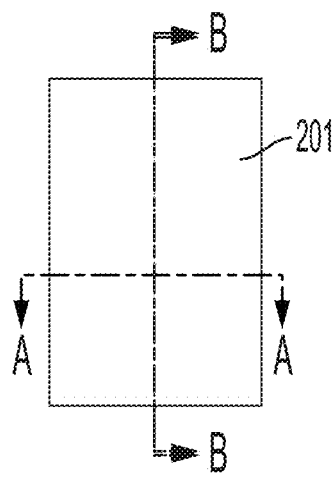
Figure 9:
Figure 9:
Figure 9:
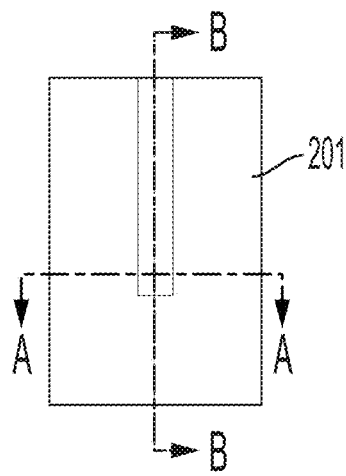
Figure 9:
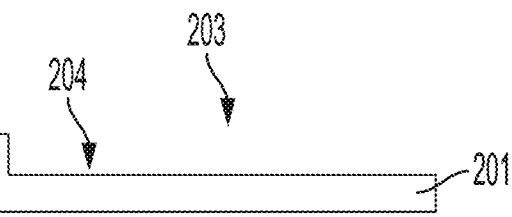
Figure 10:
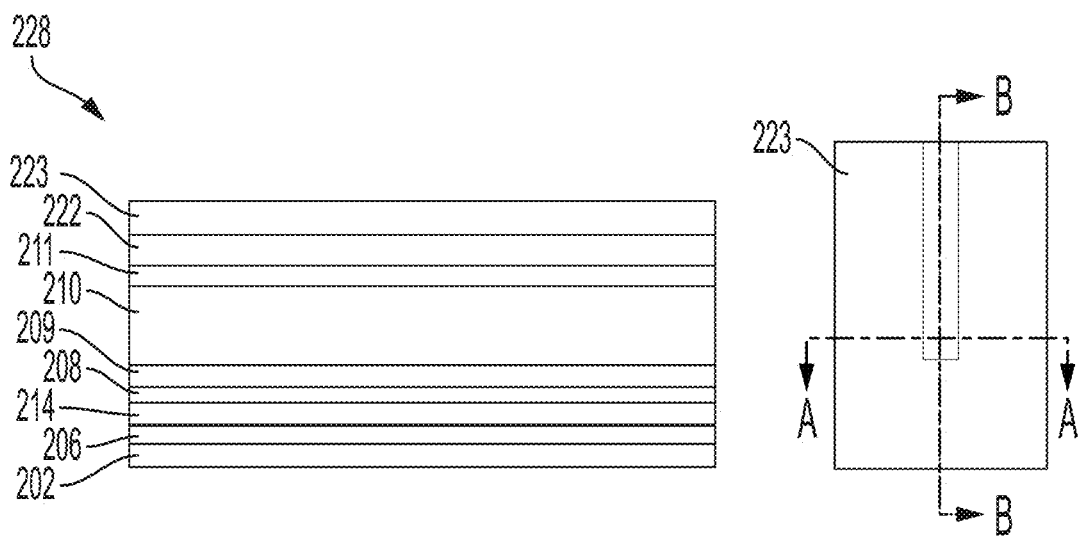
FIG. 10 shows steps involved in making quantum waveguide infrared photodetector 200 show in FIG. 2.
Figure 10:
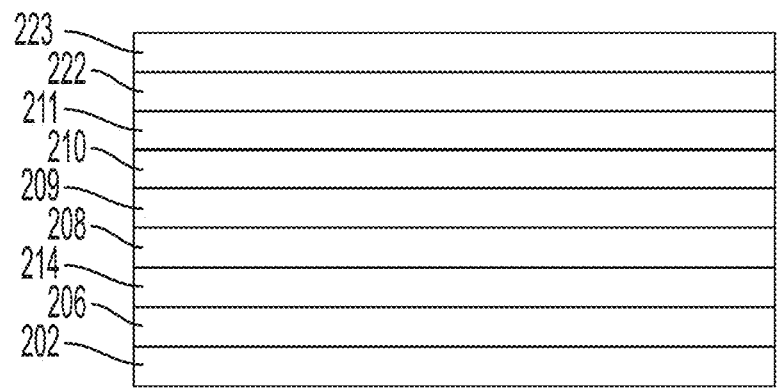
Figure 11:
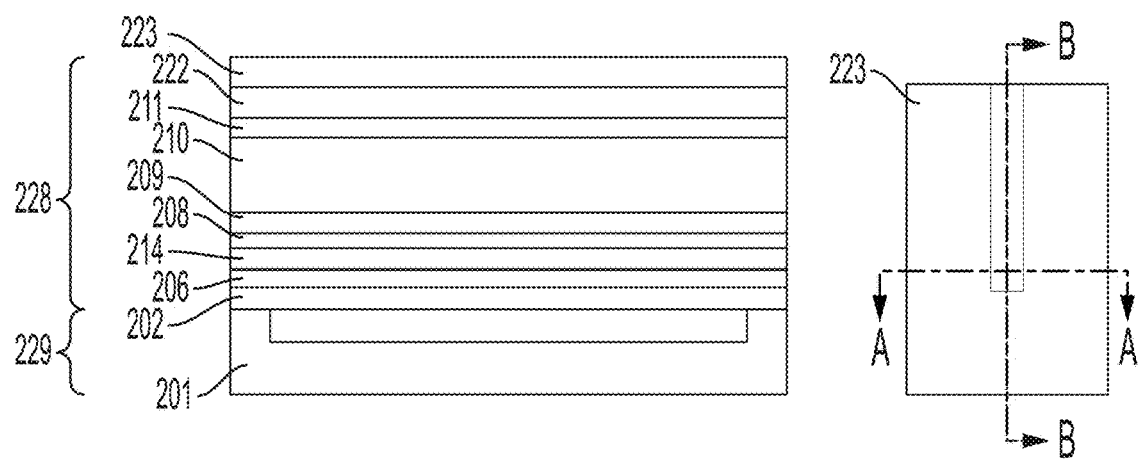
FIG. 11 shows steps involved in making quantum waveguide infrared photodetector 200 show in FIG. 2.
Figure 11:
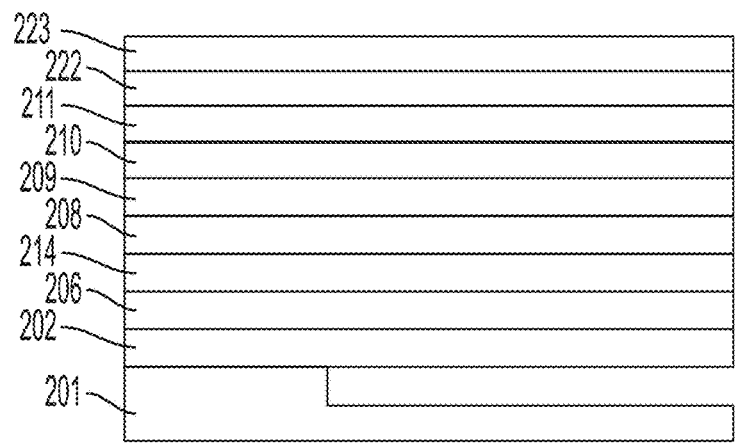
Figure 12:
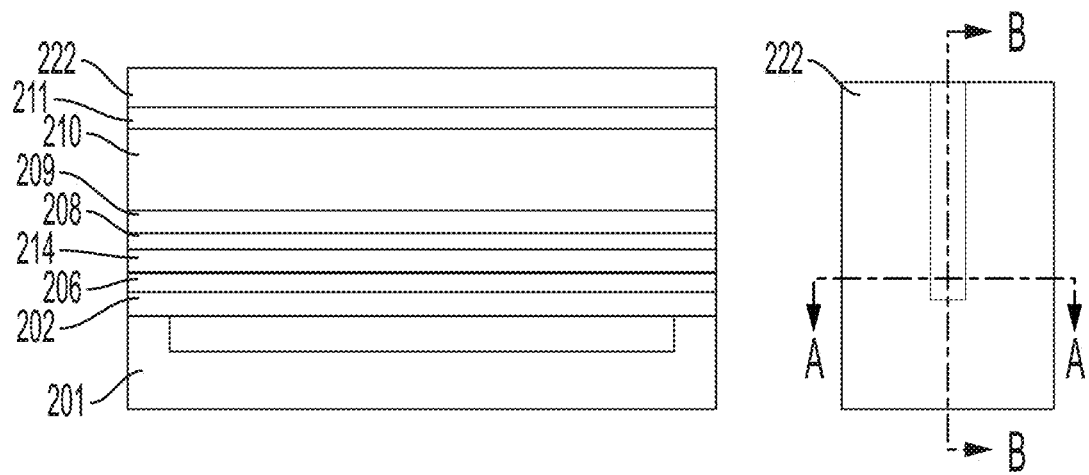
FIG. 12 shows steps involved in making quantum waveguide infrared photodetector 200 show in FIG. 2.
Figure 12:
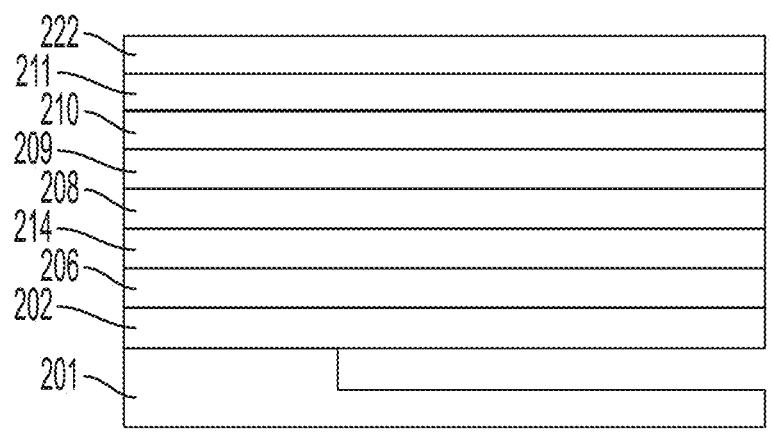
Figure 13:
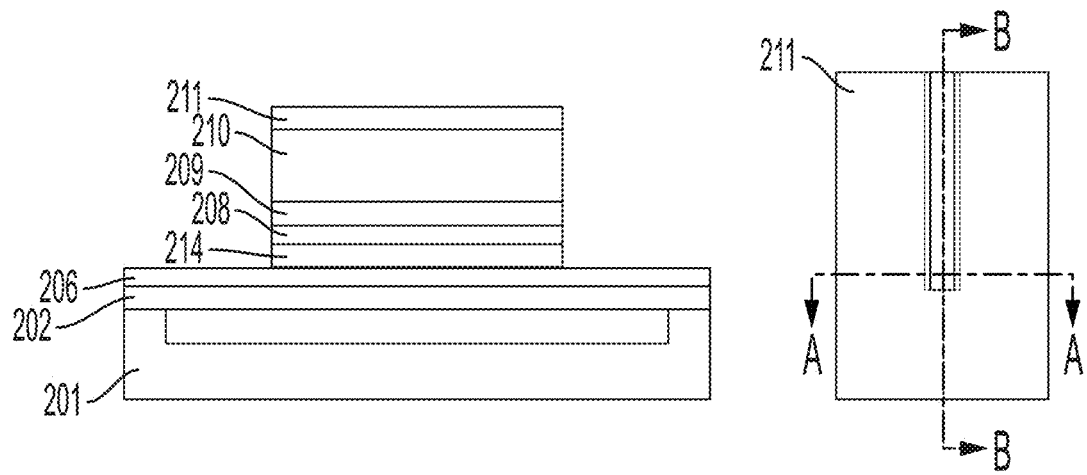
FIG. 13 shows steps involved in making quantum waveguide infrared photodetector 200 show in FIG. 2.
Figure 13:
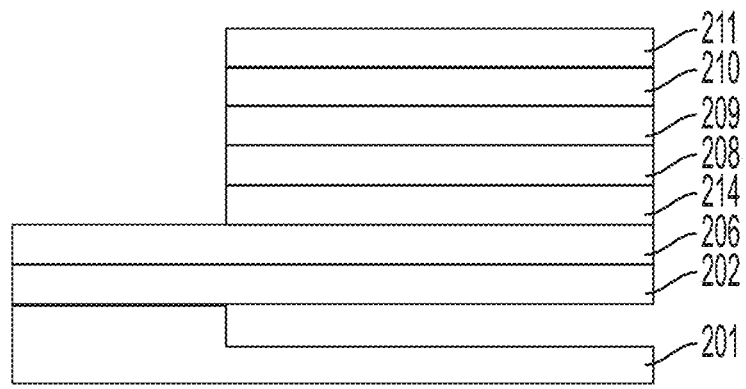
Figure 14:
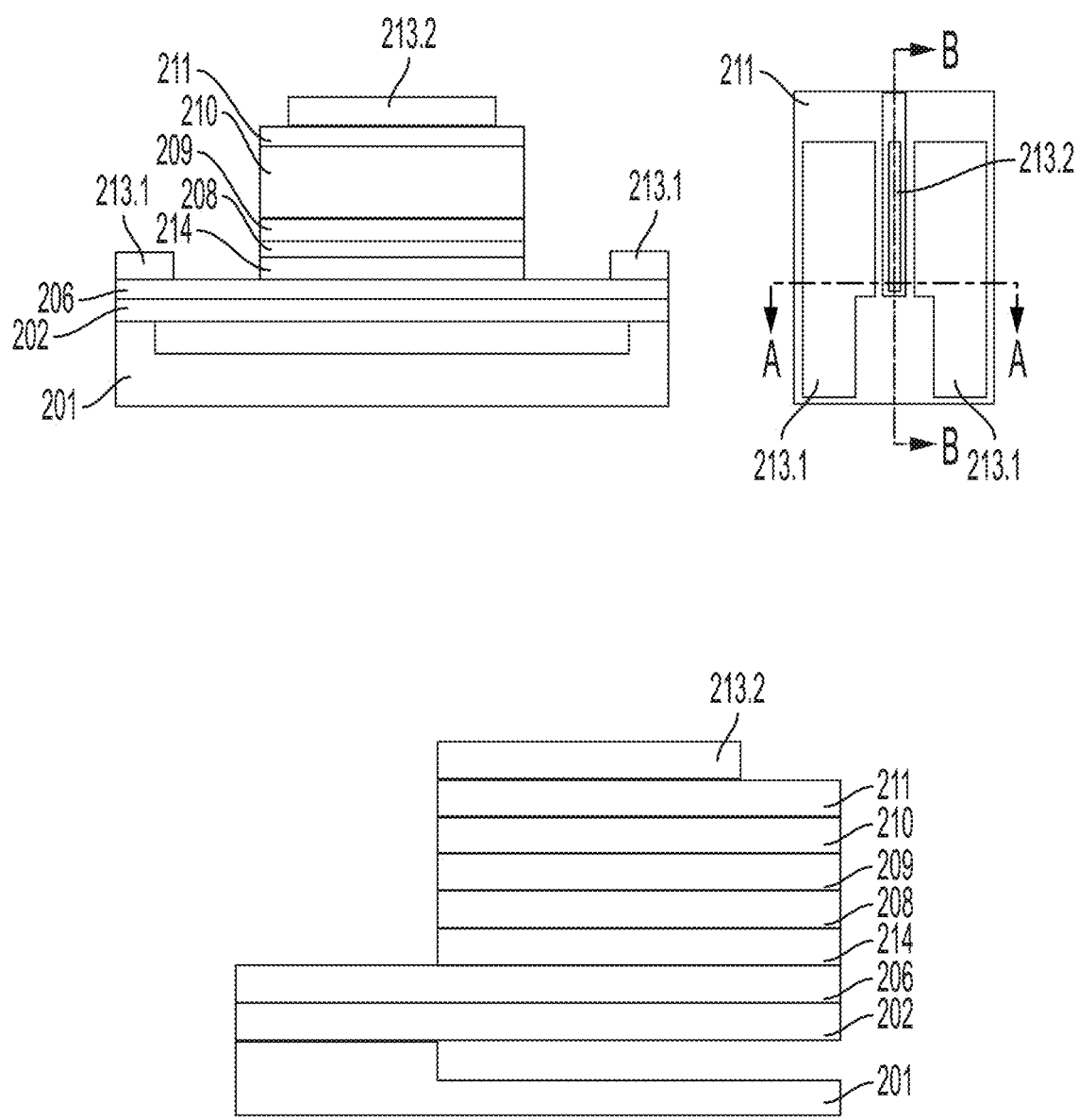
FIG. 14 shows steps involved in making quantum waveguide infrared photodetector 200 show in FIG. 2.
Figure 15:
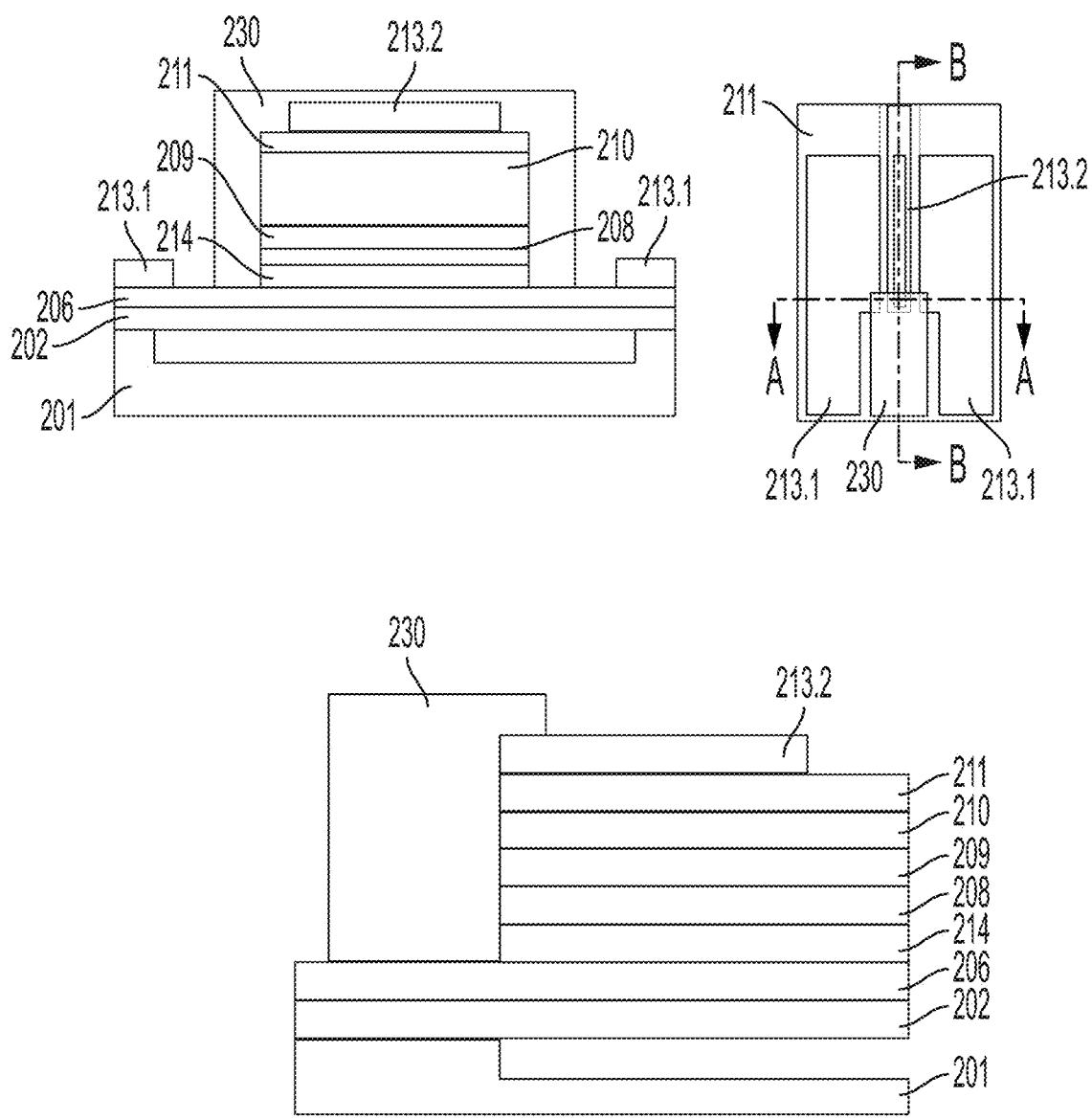
FIG. 15 shows steps involved in making quantum waveguide infrared photodetector 200 show in FIG. 2.

Infrared photons 224 are received by quantum waveguide infrared photodetector 200 and propagate longitudinally primarily in photon absorption layer 208 with a transverse electromagnetic mode that is selectively confined by the hybrid waveguide structure indicated in the immediate prior paragraph to particular layers as indicated. FIG. 8 shows a map of a magnitude of an electromagnetic field for a transverse electromagnetic mode for infrared photons 224 propagating longitudinally in photon absorption layer 208 and layers proximate to photon absorption layer 208 for a transverse cross-section of infrared photons 224. A wavelength of infrared photons 224 can be in the near infrared to far infrared region of the electromagnetic spectrum, e.g., from 700 nm to 1 mm, specifically from 1064 nm to 100 µm, and more specifically from 2000 nm to 20 µm. Further, infrared photons 224 may have electric and magnetic field orientations in any direction. It is contemplated that infrared photons 224 are converted to electrons 221 by absorption of infrared photons 224 by photon absorption layer 208. An infrared absorption band of photon absorption layer 208 depends upon layers proximate to photon absorption layer 208, wherein a composition and thickness of each layer in combination provides for a wavelength range of absorption and peak wavelength of absorption of photon absorption layer 208. In this regard, the infrared absorption band of photon absorption layer 208 can be 700 nm to 1 mm, specifically from 1064 nm to 100 µm, and more specifically from 2000 nm to 20 µm. A peak of the infrared absorption band of photon absorption layer 208 can be from 700 nm to 1 mm, specifically from 1064 nm to 100 µm, and more specifically from 2000 nm to 20 µm. Without wishing to be bound by theory, it is believed that photon absorption layer 208 converts infrared photons 224 to electrons 221 by exciting electrons from a lower energy state in the photon absorption layer 208 to a higher energy state of the photon absorption layer 208, where the lower energy state is bound, and electrons cannot exit the photon absorption layer 208 under an applied electric field and the higher energy state is coupled to the either semiconductor contact layer 206 or semiconductor contact layer 211 and electrons can exit the photon absorption layer 208 under an applied electric field.

Electrons 221 produced from infrared photons 224 have an energy provided by the potential difference subjected to electrons 221 by the first electrical potential applied to first conductor layer 213.1 and the second electrical potential applied to second conductor layer 213.2. A voltage of the first potential can be from −100 volt (V) to 100 V, specifically from −10 V to 10 V, and more specifically from −5 V to 5 V. A voltage of the second potential can be from −100 volt (V) to 100 V, specifically from −10 V to 10 V, and more specifically from −5 V to 5 V. Accordingly, an electrical potential in photon absorption layer 208 to which infrared photons 224 and nascent electrons 221 produced therefrom can be from 0 V to 200 V, specifically from 0.1 V to 20 V, and more specifically from 1 V to 10 V so that an energy of electrons 221 can be from 0 electron volts (eV) to 200 eV, specifically from 0.1 eV to 20 eV, and more specifically from 1 eV to 10 eV.

Electrons 221 communicated from photon absorption layer 208 to conductor layer 213 or electrical contact pad 220 are issued from quantum waveguide infrared photodetector 200 as detector signal 227. Detector signal 227 can be an electrical current from 1 pico ampere (pA) to 10 ampere (A), specifically from 10 pA to 1 A, and more specifically from 100 pA to 10 mA.

Quantum waveguide infrared photodetector 200 can include additional optical and electronic components including mirrors, lenses, optical fiber, electrical communication lines (e.g., coaxial cable) and the like.

Figure 2A:
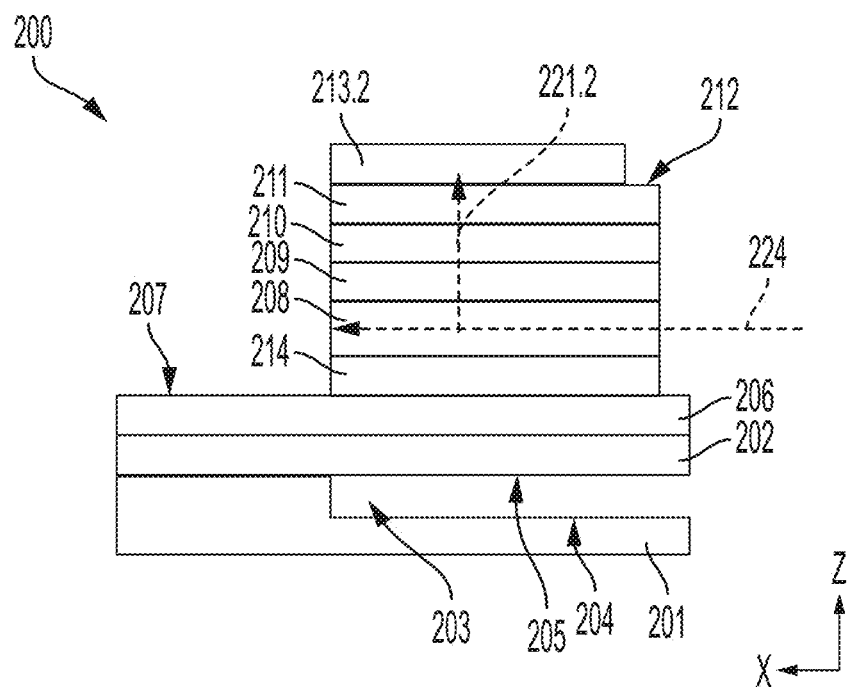
FIG. 2 shows a cross-section along line A-A in panel A and a cross-section along line B-B of an embodiment of quantum waveguide infrared photodetector 200 show in FIG. 1.
Figure 2B:
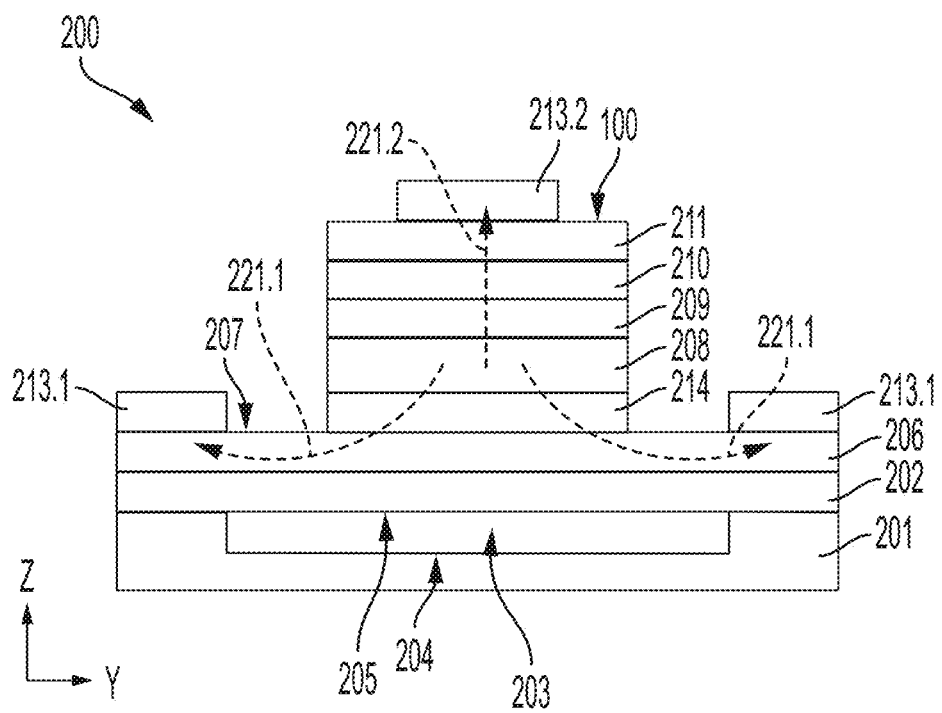
Figure 3A:
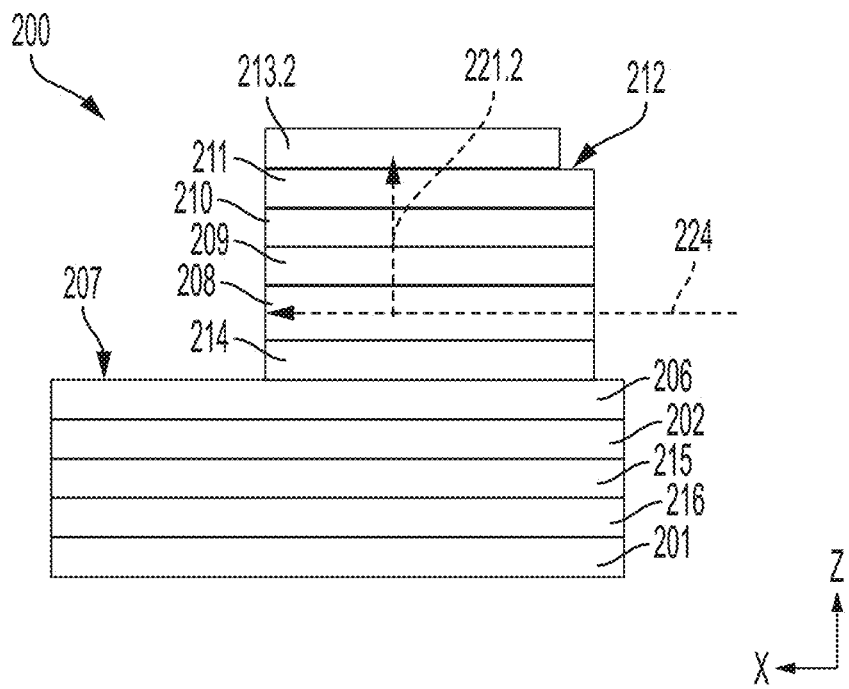
FIG. 3 shows a cross-section along line A-A in panel A and a cross-section along line B-B of an embodiment of quantum waveguide infrared photodetector 200 show in FIG. 1.
Figure 3B:
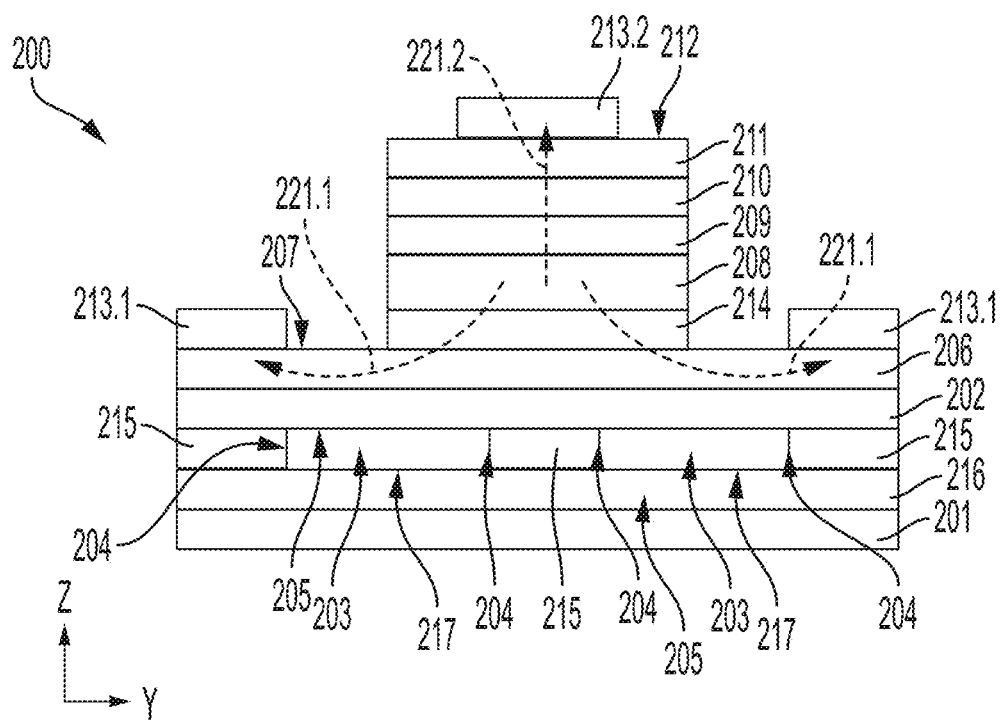
Figure 4A:
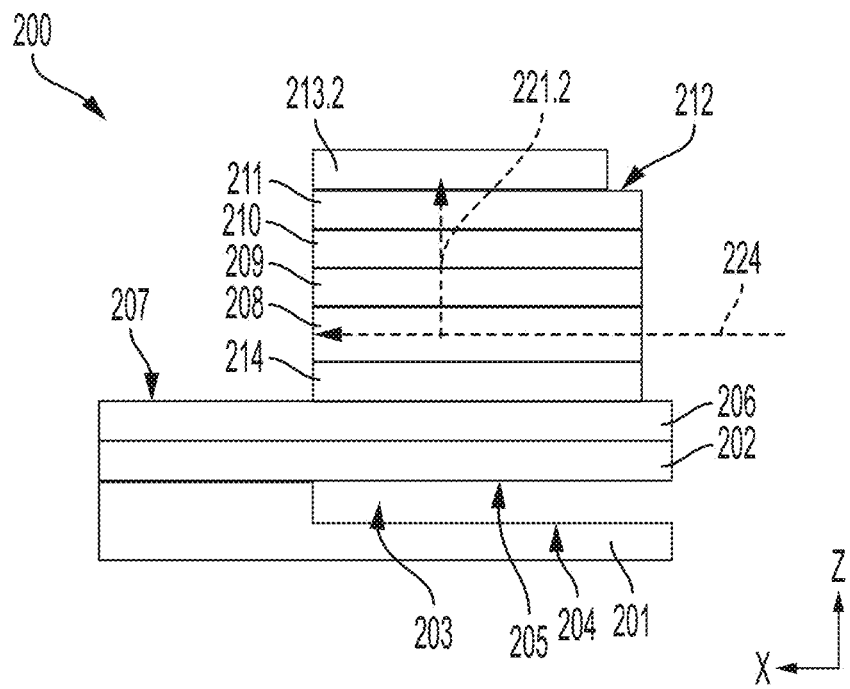
FIG. 4 shows a cross-section along line A-A in panel A and a cross-section along line B-B of an embodiment of quantum waveguide infrared photodetector 200 show in FIG. 1.
Figure 4B:
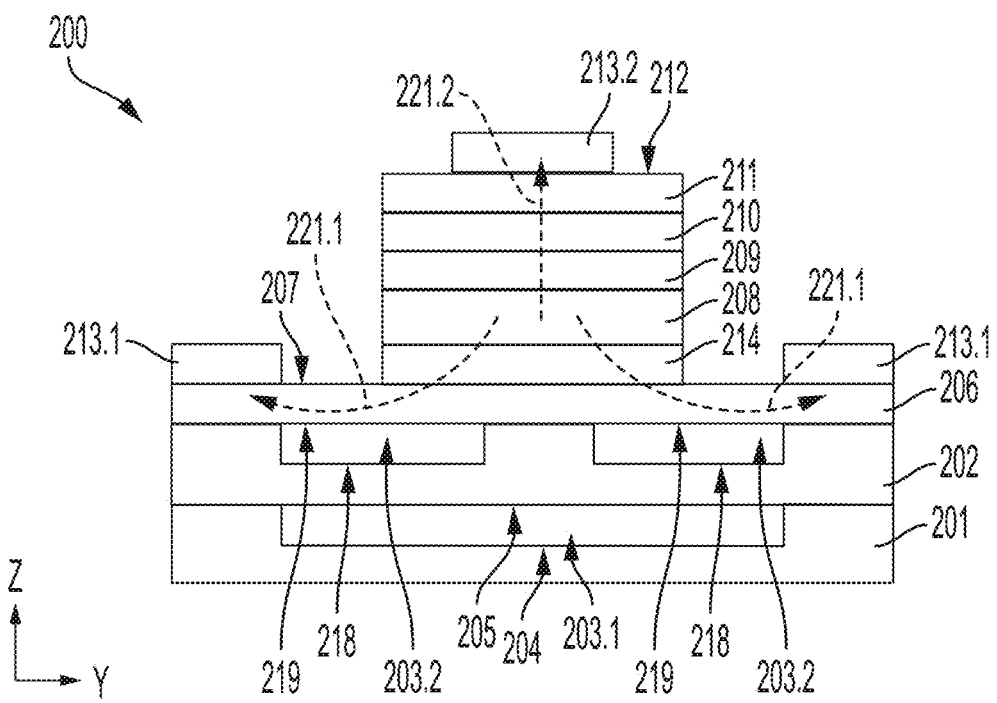

It should be appreciated that quantum waveguide infrared photodetector 200 can be configured with layers formed on a gallium arsenide substrate and bonded to a silicon substrate. With reference to FIG. 2, the silicon substrate can include an etched trench to isolate optical properties of the waveguide in quantum waveguide infrared photodetector 200 from the silicon substrate and provide a lower cladding of air, wherein this structure provides a high index of refraction contrast for the guided optical mode. With reference to FIG. 3, quantum waveguide infrared photodetector 200 can include the waveguide on a silicon substrate coupled to the GaAs-based waveguide to tailor the optical confinement laterally. The waveguide core can include silicon or another material for selective absorption of wavelengths of infrared photons 224, wherein the material can have low optical loss. A length of quantum waveguide infrared photodetector 200 can be selectively shortened so optical loss requirement can be minimized. A lower cladding shown in FIG. 3 can include a variety of materials that can ease fabrication such as including the substrate waveguide of silicon with a lower cladding of silicon dioxide. With reference to FIG. 4, quantum waveguide infrared photodetector 200 can include a double bonding fabrication step to form a GaAs waveguide to provide longer wavelength detection and to tailor the confinement of optical modes independent of a ridge width (the combined widths of photon absorption layer 208, barrier layer 209, buffer layer 210, semiconductor contact layer 211, and barrier layer 214) of quantum waveguide infrared photodetector 200. Dimensions of quantum waveguide infrared photodetector 200 can control wavelength of operation via absorption of infrared photons 224. In an embodiment, quantum waveguide infrared photodetector 200 with a suspended configuration shown in FIG. 4 can operate at 5.0 μm wavelength with a ridge width of (3.0±1.0) μm and a separation between the photon absorption layer 208, the barrier layer 209, the buffer layer 210, the semiconductor contact layer 211, and the barrier layer 214 and conductor layer 213.1 and conductor layer 213.3 of (2.5±0.5) μm. The conductor layer 213.2 can be narrower than the photon absorption layer 208, the barrier layer 209, the buffer layer 210, the semiconductor contact layer 211, and the barrier layer 214 by about 1.0 μm, to give a 500 nm offset on each side. The Si trench can be etched, e.g., to be 1.0 μm deep and as wide as (8.0±2.0) μm.

Quantum waveguide infrared photodetector 200 can be made in various ways. In an embodiment, a process for making quantum waveguide infrared photodetector 200 includes forming substrate 201 by providing a silicon wafer or a wafer of another material such as quartz or gallium arsenide; forming semiconductor member 202 on semiconductor contact layer 206 by contacting semiconductor contact layer 206 with a gaseous composition of gallium and arsenide atoms; forming mode confinement layer 203 by etching substrate 201 with a dry or wet etch chemistry in a patterned region that is wider than photon absorption layer 208, barrier layer 209, buffer layer 210, semiconductor contact layer 211, and barrier layer 214; forming substrate gap surface 204 by etching substrate 201 with a dry or wet etch chemistry in a patterned region that is wider than photon absorption layer 208, barrier layer 209, buffer layer 210, semiconductor contact layer 211, and barrier layer 214; forming semiconductor gap surface 205 by bonding to substrate 201 using a direct or interlayer surface bonding technique such as hydrophobic direct bonding; forming semiconductor contact layer 206 by contacting barrier layer 214 with a gaseous composition of gallium and arsenide atoms; forming semiconductor contact surface 207 by etching photon absorption layer 208, barrier layer 209, buffer layer 210, semiconductor contact layer 211, and barrier layer 214 with a dry or wet etch chemistry in a patterned region; forming photon absorption layer 208 by contacting barrier layer 209 with a gaseous composition of gallium and arsenide atoms and sometimes indium or aluminum atoms; forming barrier layer 209 by contacting buffer layer 210 with a gaseous composition of gallium, arsenide, and aluminum atoms; forming buffer layer 210 by contacting semiconductor contact layer 211 with a gaseous composition of gallium, arsenide, and aluminum atoms; forming semiconductor contact layer 211 by contacting semiconductor etch stop layer 222 with a gaseous composition of gallium and arsenide atoms and sometimes aluminum atoms; forming top contact surface 212 by etching semiconductor etch stop layer 222 with a dry or wet etch chemistry either patterned or not patterned; forming conductor layer 213 by physical or chemical vapor deposition over a patterned sacrificial layer; forming barrier layer 214 by contacting photon absorption layer 208 with a gaseous composition of gallium, arsenide, and aluminum atoms; forming core layer 215 by bonding core layer 215 to bottom cladding 216 using a direct or interlayer surface bonding technique (e.g., hydrophobic direct bonding) and etching core layer 215 with a dry or wet etch chemistry (e.g., boron trichloride plasma) in a patterned region; forming bottom cladding 216 by performing wet or dry thermal oxidation of substrate 201; forming cladding air gap surface 217 by etching core layer 215 with a dry or wet etch chemistry in a patterned region; forming semiconductor air gap surface 218 by etching semiconductor member 202 with a dry or wet etch chemistry in a patterned region; forming semiconductor air gap surface 219 by bonding semiconductor contact layer 206 to semiconductor member 202 using a direct or interlayer surface bonding technique; and forming electrical contact pad 220 by forming electrical contact pad 220 using physical or chemical vapor deposition over a patterned sacrificial layer. The process also can include forming semiconductor etch stop layer 222 on gallium arsenide substrate 223 by contacting gallium arsenide substrate 223 with a gaseous composition of gallium, arsenide, and aluminum atoms, semiconductor etch stop layer 222 is an etch stop layer for selectively stopping an etchant from etching layers on which semiconductor etch stop layer 222 is disposed. Moreover, layers of first ply 228 can be formed on first ply substrate 223 that can be removed by etching.

Figure 5A:
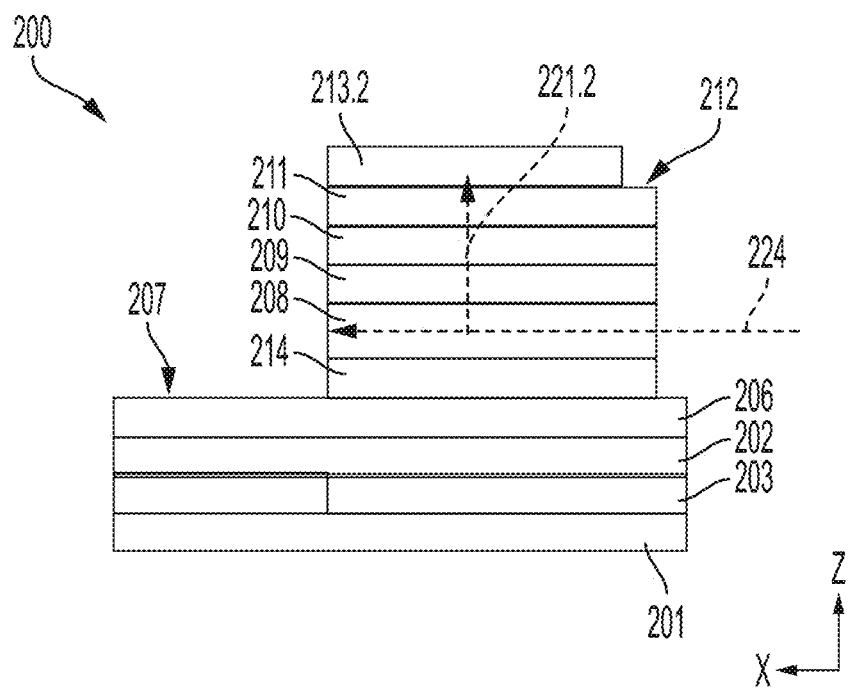
FIG. 5 shows a cross-section along line A-A in panel A and a cross-section along line B-B of an embodiment of quantum waveguide infrared photodetector 200 show in FIG. 1.
Figure 5B:
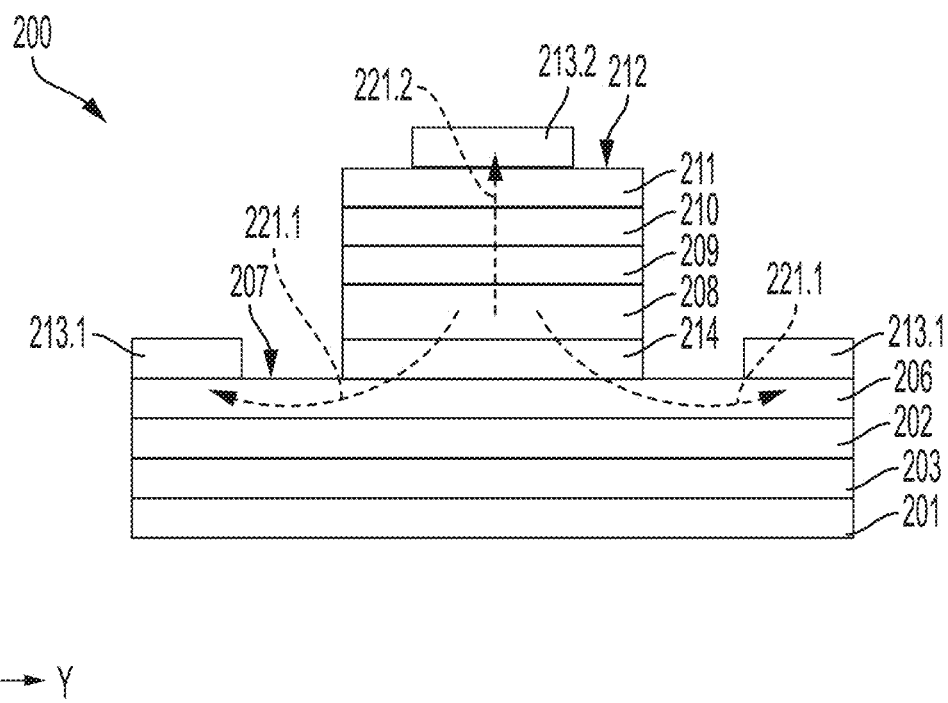
Figure 6:
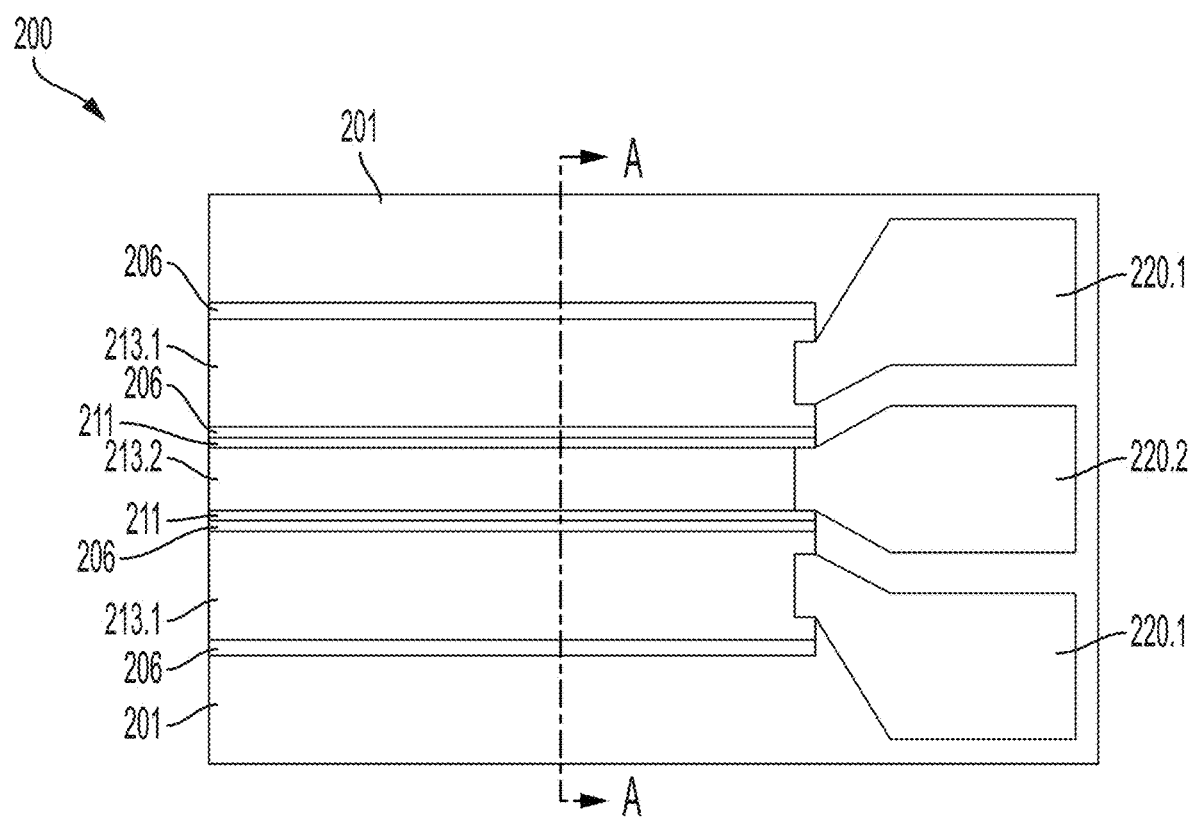
FIG. 6 shows a plan view of an embodiment of quantum waveguide infrared photodetector 200.
Figure 29:
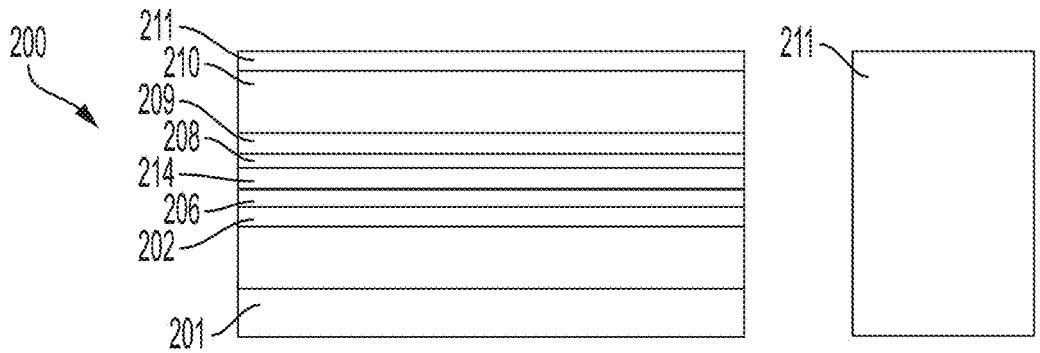
FIG. 29 shows steps involved in making quantum waveguide infrared photodetector 200 show in FIG. 5.
Figure 29:
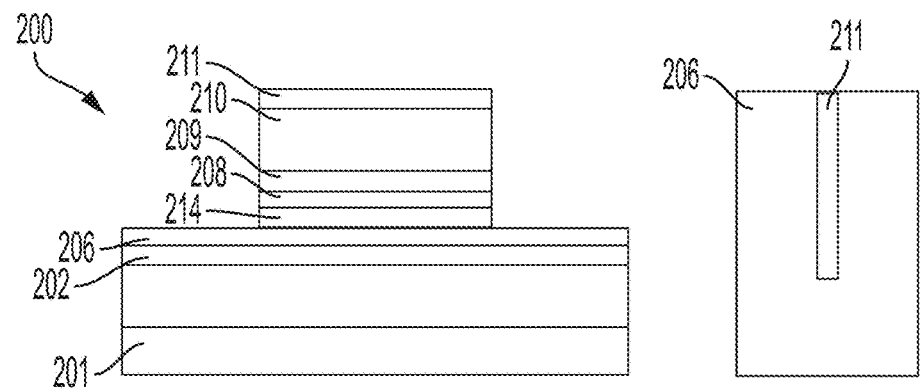
Figure 29:
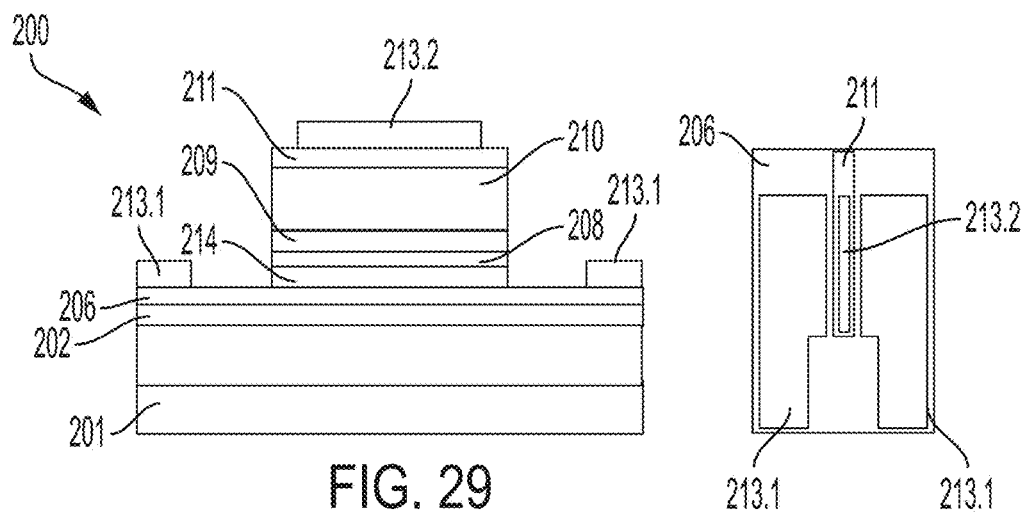
Figure 30:
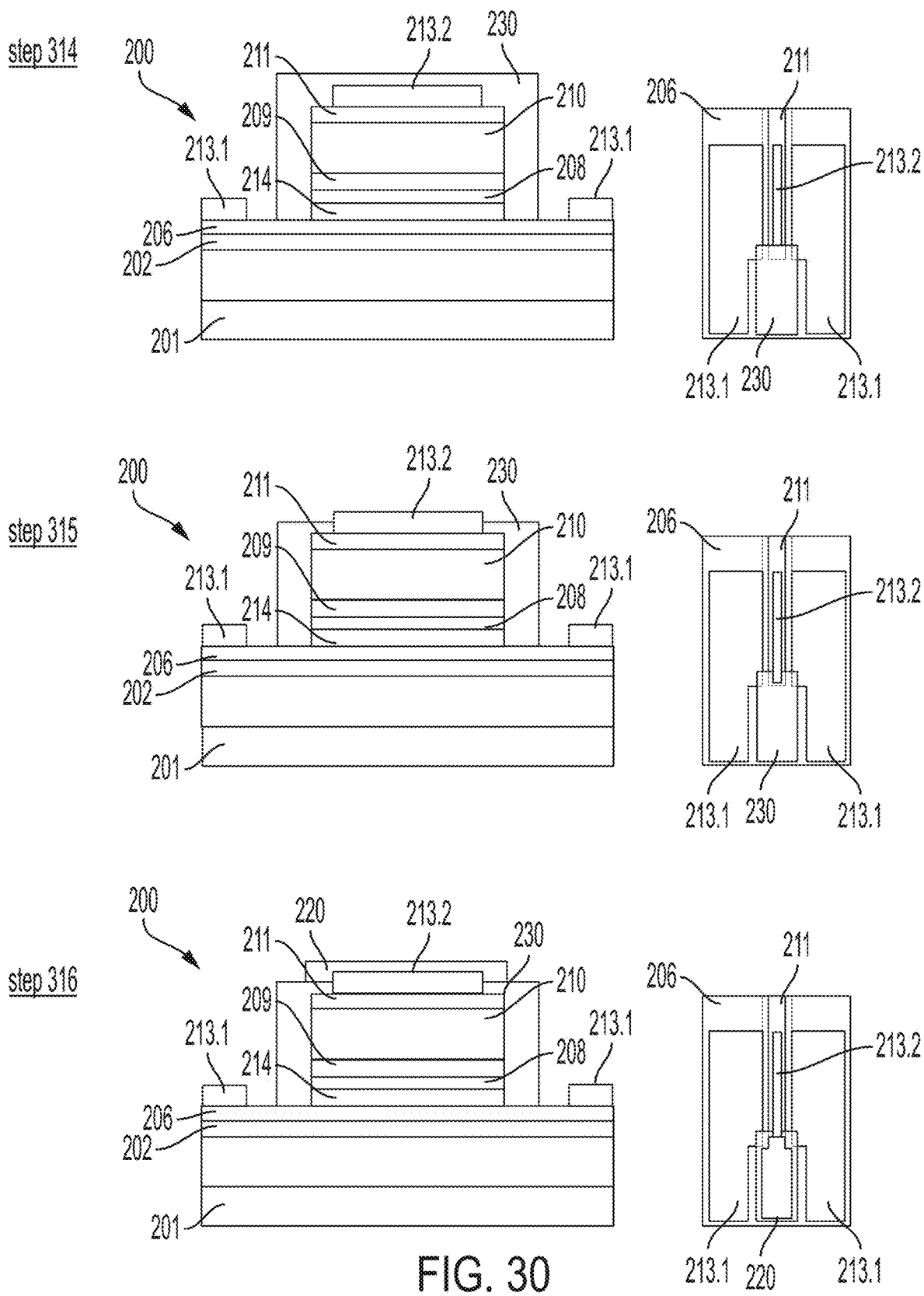
FIG. 30 shows steps involved in making quantum waveguide infrared photodetector 200 show in FIG. 5.
Figure 31:
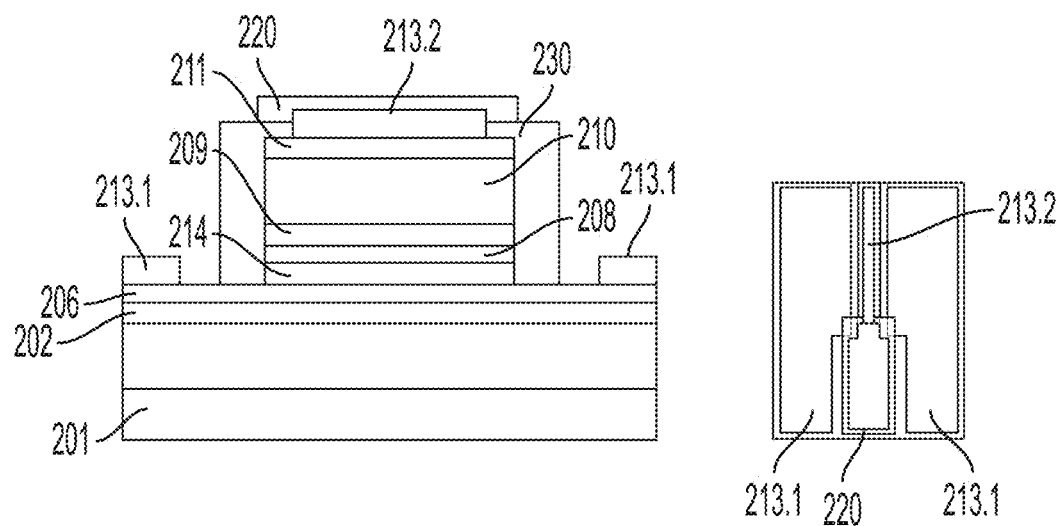
FIG. 31 shows steps involved in making quantum waveguide infrared photodetector 200 show in FIG. 5.

In an embodiment, with reference to FIG. 9 to FIG. 18 for making quantum waveguide infrared photodetector 200 shown in FIG. 2, with reference to FIG. 19 to FIG. 22 for making quantum waveguide infrared photodetector 200 shown in FIG. 3, with reference to FIG. 23 to FIG. 28 for making quantum waveguide infrared photodetector 200 shown in FIG. 4, and with reference to FIG. 29 to FIG. 31 for making quantum waveguide infrared photodetector 200 shown in FIG. 5, a process for making quantum waveguide infrared photodetector 200 includes providing substrate 201 (step 300); etching substrate 201 to form mode confinement layer 203 by patterning the substrate 201 with photoresist and etching with sulfur hexafluoride (step 301); forming first ply 228 (step 302) by disposing layers of gallium arsenide and aluminum gallium arsenide with molecular beam epitaxy on a gallium arsenide substrate; bonding first ply 228 to second ply 229 (step 303) by hydrophobic direct bonding; removing first ply substrate 223 (step 304) by wet etching with ammonium hydroxide, hydrochloric acid, and water; etching semiconductor contact layer 206, barrier layer 214, photon absorption layer 208, barrier layer 209, buffer layer 210, and semiconductor contact layer 211 (step 305) by patterning with photoresist and exposure to silicon tetrachloride plasma; forming conductor layer 213 (step 306) by electron beam evaporation; forming electrical insulator 230 (step 307) by spinning and exposing a photosensitive dielectric with a pattern; removing a portion of electrical insulator 230 (step 308) by dry ashing with oxygen plasma; forming electrical contact pad 220 (step 309) by electron beam evaporation; and removing a section of layers adjoining the quantum waveguide infrared photodetector 200 (step 310) by etching with silicon tetrachloride plasma.

Figure 23:
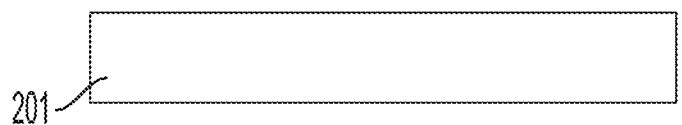
FIG. 23 shows steps involved in making quantum waveguide infrared photodetector 200 show in FIG. 4.
Figure 23:
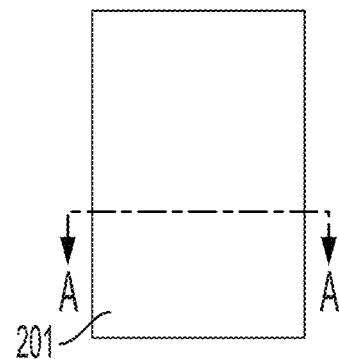
Figure 23:
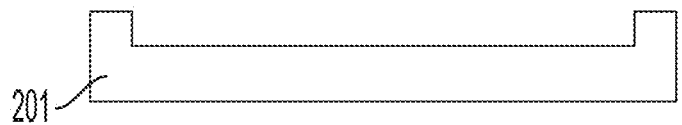
Figure 23:
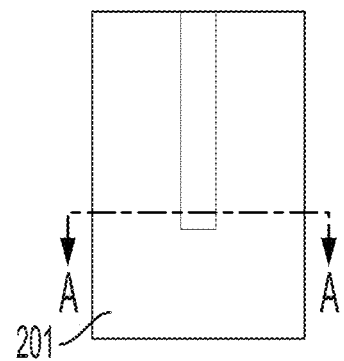
Figure 23:
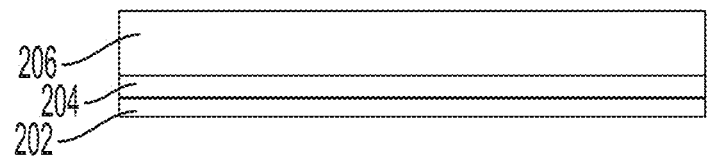
Figure 23:
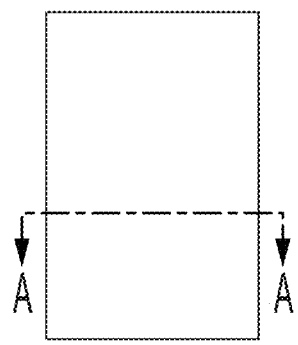
Figure 24:
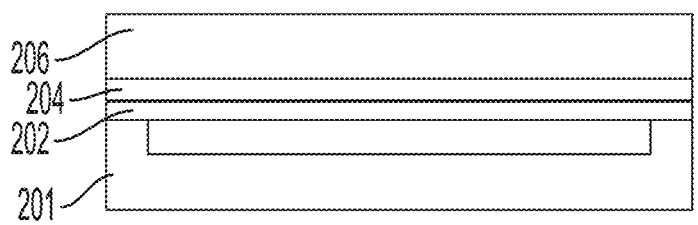
FIG. 24 shows steps involved in making quantum waveguide infrared photodetector 200 show in FIG. 4.
Figure 24:
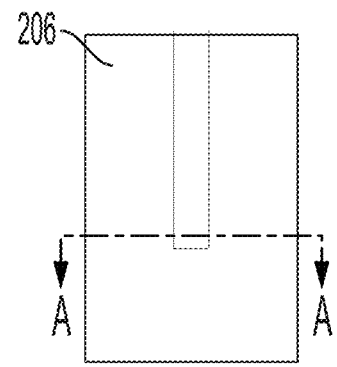
Figure 24:
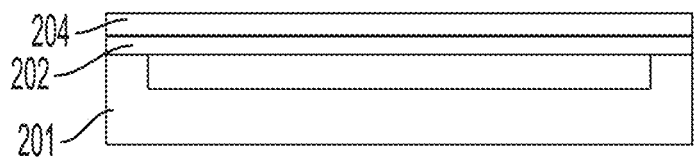
Figure 24:
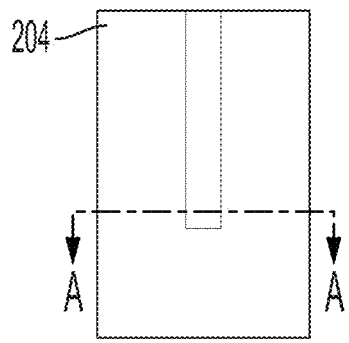
Figure 24:
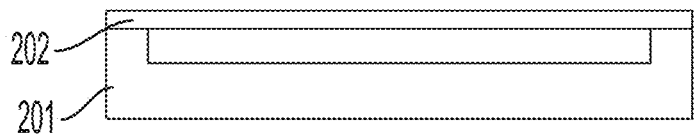
Figure 24:
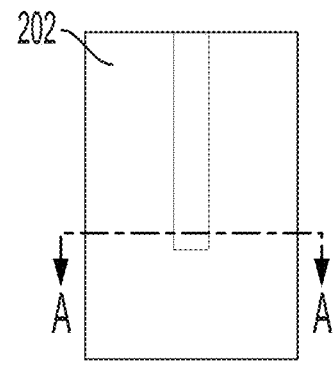
Figure 25:
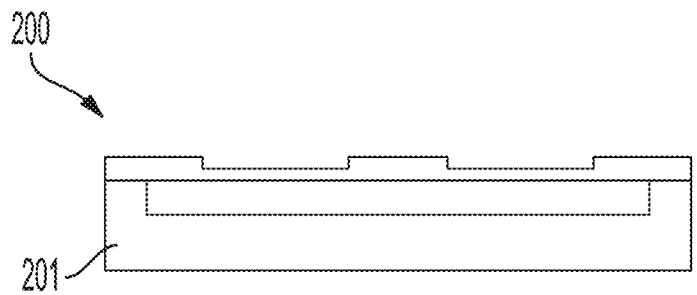
FIG. 25 shows steps involved in making quantum waveguide infrared photodetector 200 show in FIG. 4.
Figure 25:
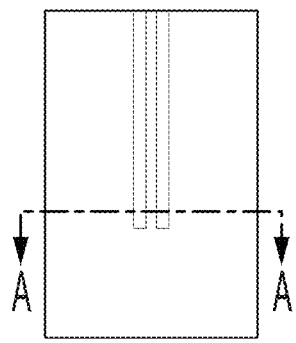
Figure 25:
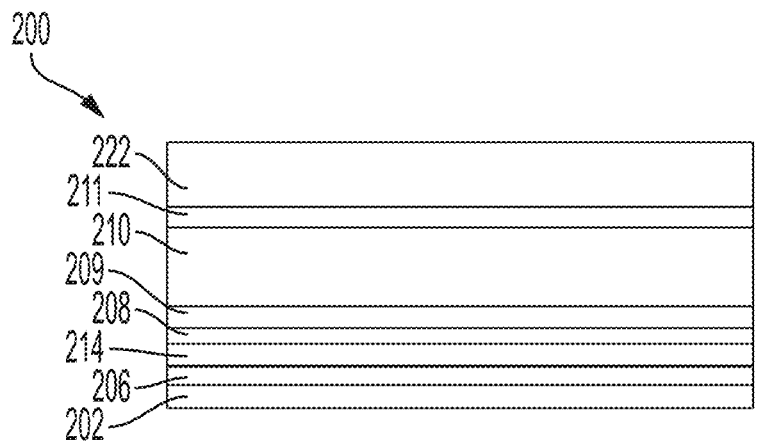
Figure 25:
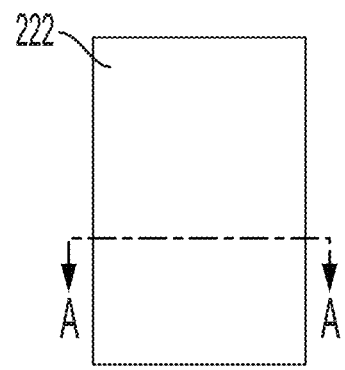
Figure 26:
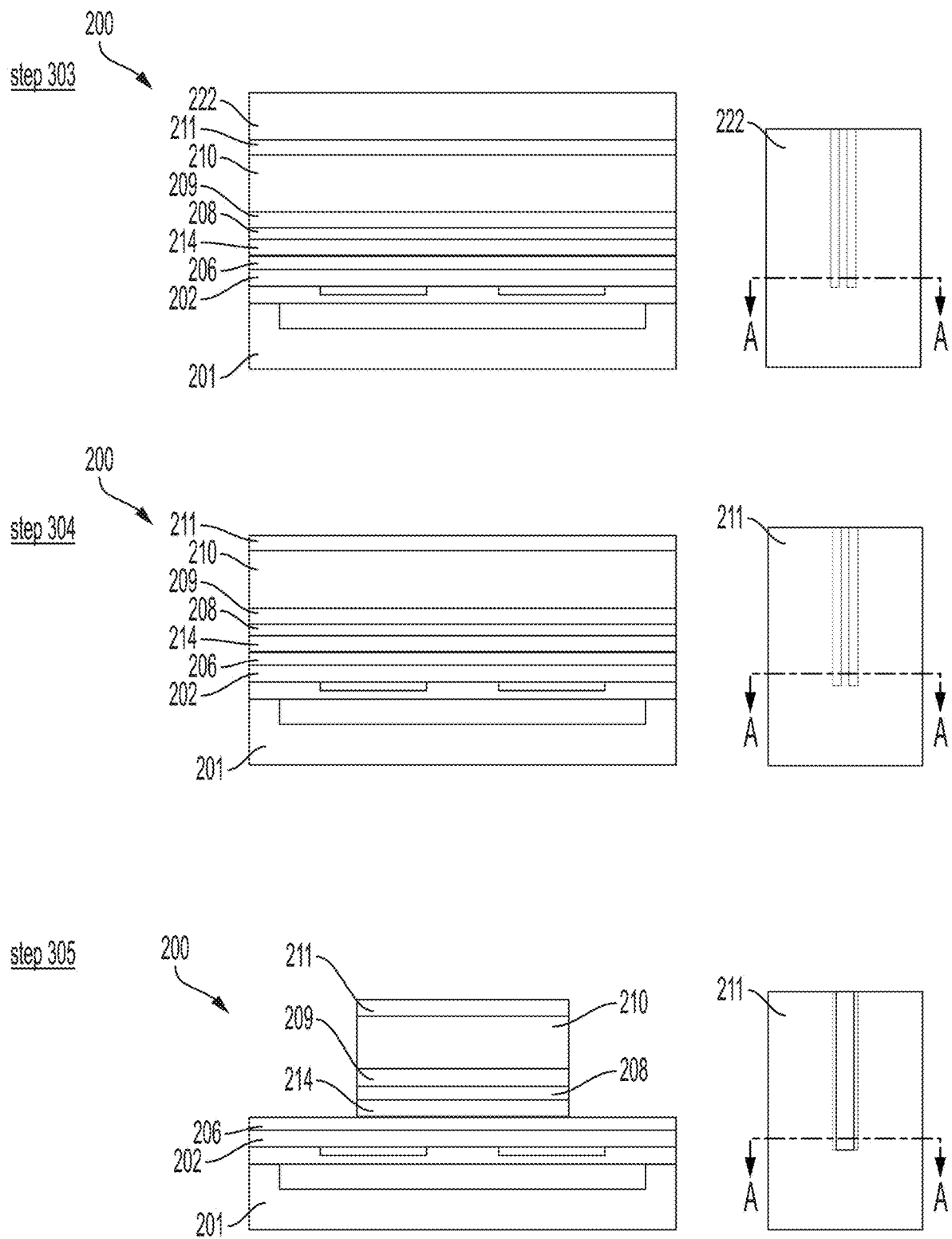
FIG. 26 shows steps involved in making quantum waveguide infrared photodetector 200 show in FIG. 4.
Figure 27:
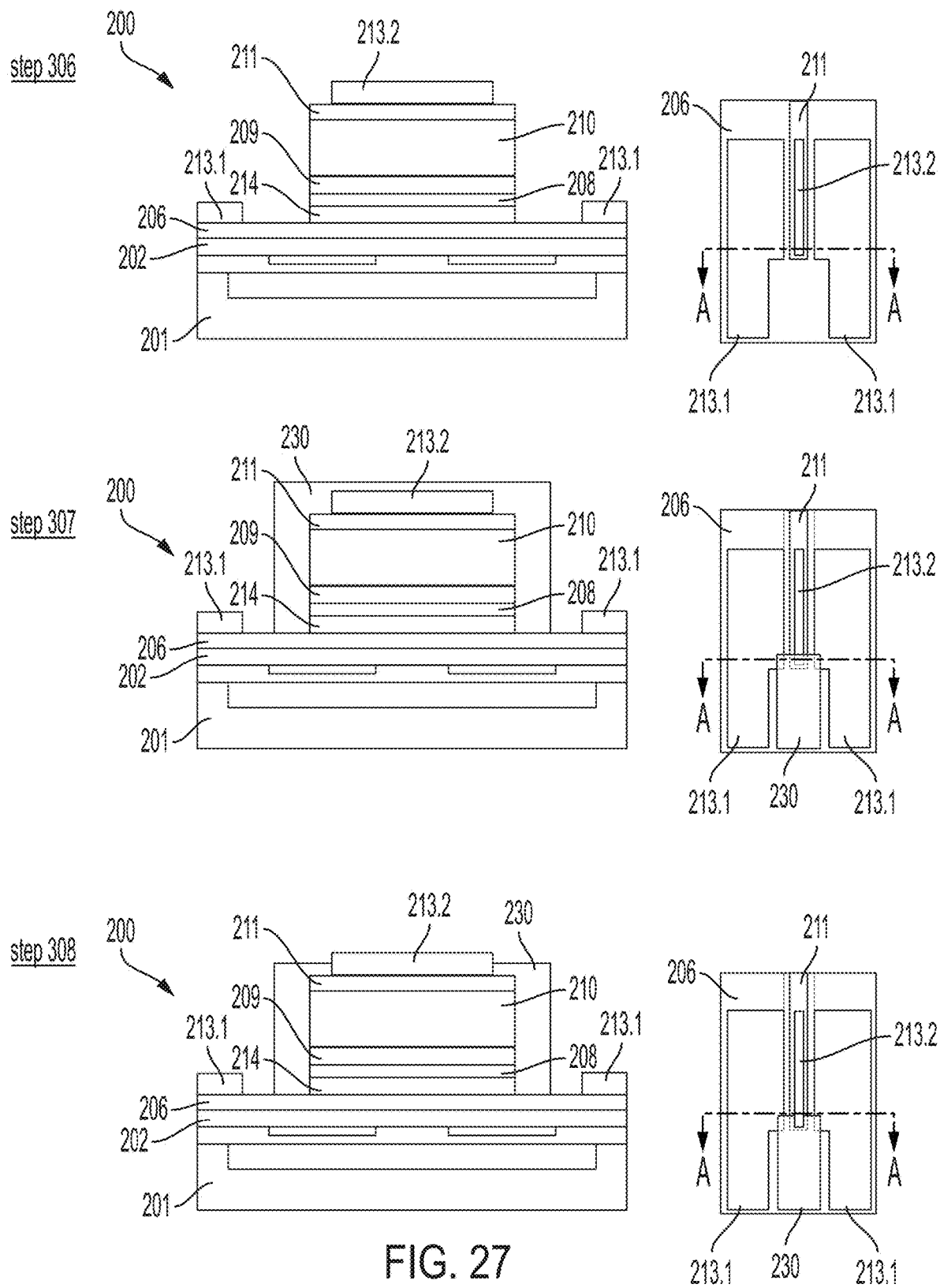
FIG. 27 shows steps involved in making quantum waveguide infrared photodetector 200 show in FIG. 4.
Figure 28:
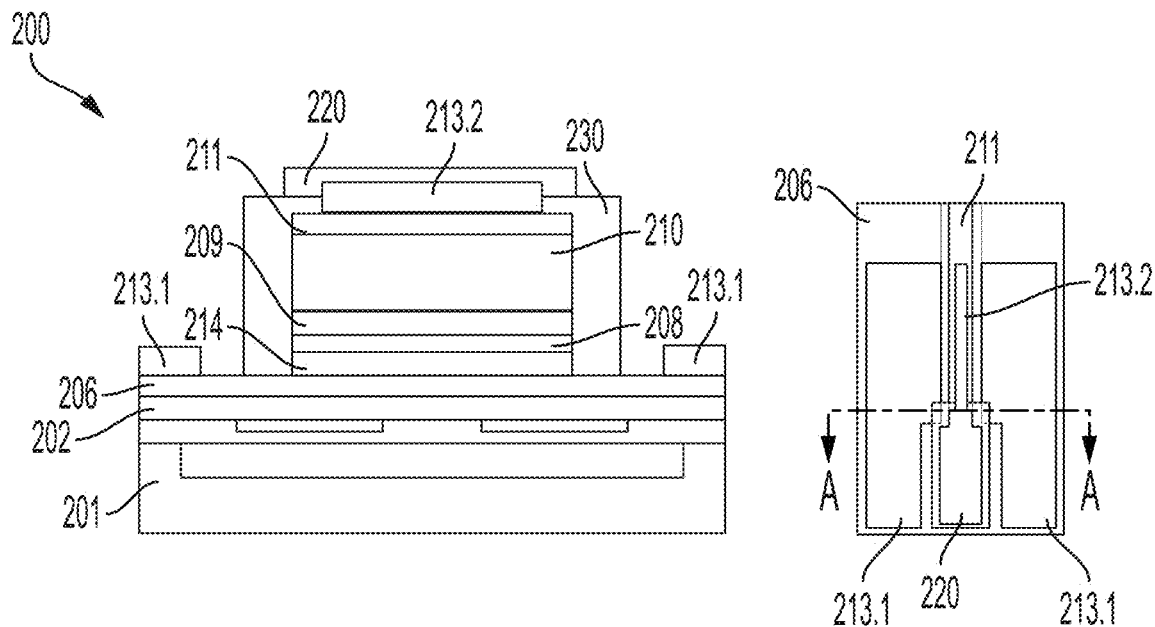
FIG. 28 shows steps involved in making quantum waveguide infrared photodetector 200 show in FIG. 4.
Figure 28:
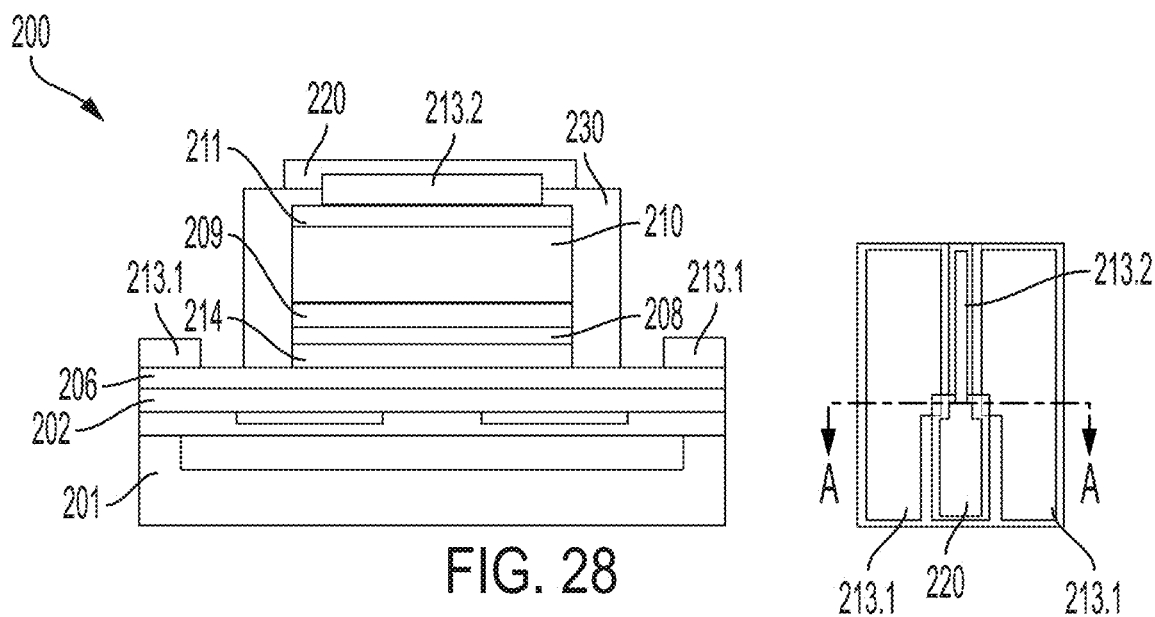

In an embodiment, with reference to FIG. 23 and FIG. 24, the process for making quantum waveguide infrared photodetector 200 includes forming a preliminary bonded interface with a patterned air gap trench at the interface (step 298) by etching the first wafer, growing a multilayer film on the second wafer, and then bonding the first wafer to the second wafer; and forming a planar thin membrane (step 299) by removing the substrate from the second wafer and leaving the multilayer film bonded to the first wafer.

The process for making quantum waveguide infrared photodetector 200 also can include providing a substrate (step 311) with epitaxially grown layers that form the entire quantum waveguide infrared photodetector 200; etching semiconductor contact layer 206, barrier layer 214, photon absorption layer 208, barrier layer 209, buffer layer 210, and semiconductor contact layer 211 (step 305) by patterning with photoresist and exposure to silicon tetrachloride plasma; forming conductor layer 213 (step 306) by electron beam evaporation; forming electrical insulator 230 (step 307) by spinning and exposing a photosensitive dielectric with a pattern; removing a portion of electrical insulator 230 (step 308) by dry ashing with oxygen plasma; forming electrical contact pad 220 (step 309) by electron beam evaporation; and removing a section of layers adjoining the quantum waveguide infrared photodetector 200 (step 310) by etching with silicon tetrachloride plasma.

Quantum waveguide infrared photodetector 200 has numerous advantageous and unexpected benefits and uses. In an embodiment, a process for detecting infrared photons by intersubband transitions in a semiconductor of photon absorption layer 208 with quantum waveguide infrared photodetector 200 includes: receiving, by photon absorption layer 208, infrared photons 224; propagating longitudinally infrared photons 224 along the longitudinal length of photon absorption layer 208; converting, by photon absorption layer 208, infrared photons 224 into electrons 221 by intersubband transitions in the semiconductor of photon absorption layer 208; biasing first conductor layer 213.1 with the first electrical potential; biasing second conductor layer 213.2 with the second electrical potential; communicating electrons 221 from photon absorption layer 208 to first conductor layer 213.1 when the first electrical potential is more positive than the second electrical potential; and communicating electrons 221 from photon absorption layer 208 to second conductor layer 213.2 when the second electrical potential is more positive than the first electrical potential to detect the infrared photons, wherein an electrical current produced by electrons 221 is proportional to the amount of absorption of infrared photons 224 in photon absorption layer 208. The process also can include communicating electrons 221 as detector signal 227 from first conductor layer 213.1 to current meter 226 when the first electrical potential is more positive than the second electrical potential. The process also can include communicating the electrons 221 as detector signal 227 from second conductor layer 213.2 to current meter 226 when the second electrical potential is more positive than the first electrical potential. A fluence of infrared photons 224 received by quantum waveguide infrared photodetector 200 can be determined from detector signal 227 by measuring and integrating the electrical current produced by the quantum waveguide infrared photodetector 200 under a voltage bias over time.

Quantum waveguide infrared photodetector 200 and processes disclosed herein have numerous beneficial uses, including room temperature infrared detection at high speed, high sensitivity, and in a compact package. Advantageously, quantum waveguide infrared photodetector 200 overcomes limitations of technical deficiencies of conventional compositions such as low absorption per quantum well, leading to large numbers of quantum wells and associated high dark current and noise current. Further, the quantum waveguide infrared photodetector reduces the cross-sectional area of the photon absorbing layer 208 in the direction of current flow and subsequently the current noise.

Quantum waveguide infrared photodetector 200 and processes herein unexpectedly produce higher detection sensitivity with lower current noise than conventional technologies at the same temperature. Moreover, quantum waveguide infrared photodetector 200 provides equivalent detection sensitivity and current noise at a higher temperature, e.g., room temperature, compared to cryogenic temperature operation of conventional technologies. Conventional technologies include surface normal irradiated quantum well infrared photodetectors (QWIPs), quantum dot infrared photodetectors (QDIPs), quantum cascade detectors (QCDs), inter-band cascade detectors (ICDs), mercury-cadmium-telluride detectors (MCTs), deuterated L-alanine doped triglycine sulfate (DLaTGS), and pyroelectric detectors. These conventional detectors work for lower-speed detection applications. Beneficially, quantum waveguide infrared photodetector 200 has comparatively higher performance than these conventional technologies in terms of detection speed, sensitivity, and noise level and a lower cost to fabricate and produce. Additionally, a QWIP with surface normal detection can be formatted into infrared focal plane arrays for infrared cameras. Quantum waveguide infrared photodetector 200 detects light incident on a single detector element in the plane of the material growth and uses an absorbing region for intersubband transition in a quantum well and waveguiding has been developed for photodiodes using inter-band absorption. Unexpectedly, quantum waveguide infrared photodetector 200 has high efficiency with high index contrast on a silicon substrate. Quantum waveguide infrared photodetector 200 is made by wafer bonding photodetector material to a separate wafer rather than fabricating the detector on a native substrate on which QWIP layers are grown. As a result, quantum waveguide infrared photodetector 200 can be formed with a decrease in the number of quantum wells and a decrease in the cross-sectional area of current flow compared with conventional devices, while maintaining at least as high optical absorption efficiency as conventional devices. Accordingly, quantum waveguide infrared photodetector 200 has greater responsivity, less dark current noise, and greater signal-to-noise ratio than conventional devices.

The articles and processes herein are illustrated further by the following Example, which is non-limiting.

EXAMPLE

Layers for an exemplary quantum waveguide infrared photodetector 200 are listed in the Table. A primary absorbing region includes $In_{0.1}Ga_{0.9}As$ layers proximate to $Al_{0.4}Ga_{0.6}As$ layers, wherein the configuration absorbs infrared light near 5.0 μm wavelength with a bandwidth of about 100 nm. Changing a thickness of the $In_{0.1}Ga_{0.9}As$ layer to match an energy difference between the $In_{0.1}Ga_{0.9}As$ quantum well and adjacent $Al_{0.4}Ga_{0.6}As$ barrier layer provides selective absorption of a different central absorption wavelength.

TABLE

| Element | Material | Thickness (nm) | Doping ($cm^{-3}$) |
|---|---|---|---|
| semiconductor member 202 | GaAs | 900 | Intrinsic |
| semiconductor contact layer 206 | GaAs | 200 | $2 \times 10^{18}$ |
| barrier layer 214 | $A_{0.4}Ga_{0.6}As$ | 40 | Intrinsic |
| photon absorption layer 208 | $In_{0.1}Ga_{0.9}As$ | 0.5 | Intrinsic |
| photon absorption layer 208 | $In_{0.1}Ga_{0.9}As$ | 2.85 | $2 \times 10^{18}$ |
| photon absorption layer 208 | $In_{0.1}Ga_{0.9}As$ | 0.5 | Intrinsic |
| barrier layer 209 | $Al_{0.4}Ga_{0.6}As$ | 400 | Intrinsic |
| buffer layer 210 | $Al_{0.8 \, to \, 0.4}Ga_{0.2 \, to \, 0.6}As$ | 200 | Intrinsic |
| buffer layer 210 | $Al_{0.8}Ga_{0.2}As$ | 3000 | Intrinsic |
| semiconductor contact layer 211 | GaAs | 50 | $2 \times 10^{18}$ |
| semiconductor etch stop layer 222 | $Al_{0.8}Ga_{0.2}As$ | 150 | Intrinsic |
| first ply substrate 223 | GaAs substrate | $625 \times 10^3$ | Intrinsic |

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A quantum waveguide infrared photodetector for detecting infrared photons by intersubband transitions in a semiconductor of a photon absorption layer, the quantum waveguide infrared photodetector comprising:

the photon absorption layer that receives infrared photons propagating longitudinally along a longitudinal length of the photon absorption layer, converts the infrared photons into electrons, and communicates the electrons to a conductor layer;

a barrier layer on which the photon absorption layer is disposed;

a first semiconductor contact layer on which the barrier layer is disposed;

a semiconductor member on which the semiconductor contact layer is disposed;

a substrate on which the semiconductor member is disposed;

a barrier layer disposed on the photon absorption layer;

a buffer layer disposed on the barrier layer;

a second semiconductor contact layer disposed on the buffer layer;

a first conductor layer disposed on the first semiconductor contact layer and that receives a first electrical potential; and a second conductor layer disposed on the second semiconductor contact layer and that receives a second electrical potential, wherein electrons produced by the photon absorption layer in response to receipt of the infrared photons are communicated from the photon absorption layer:

to the first conductor layer when the first electrical potential is more positive than the second electrical potential, and to the second conductor layer when the second electrical potential is more positive than the first electrical potential, and wherein an electrical current produced by the electrons is proportional to an amount of absorption of the infrared photons in the photon absorption layer.

2. The quantum waveguide infrared photodetector of claim 1, further comprising a mode confinement layer interposed between the substrate and the semiconductor member and bounded by surfaces of the substrate and the semiconductor member.

3. The quantum waveguide infrared photodetector of claim 2, further comprising a second mode confinement layer disposed in semiconductor member, interposed between the semiconductor member and the semiconductor contact layer, and bounded by surfaces of the semiconductor member and the semiconductor contact layer.

4. The quantum waveguide infrared photodetector of claim 1, further comprising a core layer interposed between the substrate and the semiconductor member.

5. The quantum waveguide infrared photodetector of claim 4, further comprising a bottom cladding interposed between the core layer and the substrate.

6. The quantum waveguide infrared photodetector of claim 5, further comprising a mode confinement layer disposed in core layer and interposed between the bottom cladding and the semiconductor member.

7. The quantum waveguide infrared photodetector of claim 6, wherein the mode confinement layer is bounded by surfaces of the bottom cladding, the core layer, and the semiconductor member.

8. The quantum waveguide infrared photodetector of claim 1, further comprising a first electrical contact pad disposed on the substrate and the first conductor layer and in electrical communication with the first conductor layer, such that the first electrical contact pad receives the first electrical potential for electrically biasing the first conductor layer.

9. The quantum waveguide infrared photodetector of claim 8, further comprising a second electrical contact pad disposed on the substrate and the second conductor layer and in electrical communication with the second conductor layer, such that the second electrical contact pad receives the second electrical potential for electrically biasing the second conductor layer.

10. The quantum waveguide infrared photodetector of claim 1, further comprising an electrical insulator disposed on the semiconductor contact layer and the semiconductor contact layer and that electrically insulates the first conductor layer from the second conductor layer.

11. The quantum waveguide infrared photodetector of claim 1, further comprising an electrical bias supply in electrical communication with the first conductor layer and the second conductor layer, wherein the electrical bias supply provides the first electrical potential to the first conductor layer and the second electrical potential to the second conductor layer.

12. The quantum waveguide infrared photodetector of claim 11, further comprising a current meter in electrical communication with the first conductor layer and the electrical bias supply, wherein the current meter receives a detector signal and determines the amount of electrical current from the detector signal.

13. The quantum waveguide infrared photodetector of claim 1, wherein the photon absorption layer comprises a quantum well, quantum dots, or a quantum dash.

14. A process for detecting infrared photons by intersubband transitions in a semiconductor of a photon absorption layer with the quantum waveguide infrared photodetector of claim 1, the process comprising:

receiving, by the photon absorption layer, the infrared photons;

propagating longitudinally the infrared photons along the longitudinal length of the photon absorption layer;

converting, by the photon absorption layer, the infrared photons into electrons by intersubband transitions in the semiconductor of the photon absorption layer;

biasing the first conductor layer with the first electrical potential;

biasing the second conductor layer with the second electrical potential;

communicating the electrons from the photon absorption layer to the first conductor layer when the first electrical potential is more positive than the second electrical potential; and communicating the electrons from the photon absorption layer to the second conductor layer when the second electrical potential is more positive than the first electrical potential to detect the infrared photons, wherein an electrical current produced by the electrons is proportional to the amount of absorption of the infrared photons in the photon absorption layer.

15. The process of claim 14, further comprising communicating the electrons as a detector signal from the first conductor layer to a current meter when the first electrical potential is more positive than the second electrical potential.

16. The process of claim 14, further comprising communicating the electrons as a detector signal from the second conductor layer to a current meter when the second electrical potential is more positive than the first electrical potential.

* * * * *